(12) United States Patent
Toyotaka

(10) Patent No.: US 8,803,559 B2
(45) Date of Patent: Aug. 12, 2014

(54) SEMICONDUCTOR CIRCUIT HAVING SWITCHING ELEMENT, CAPACITOR, AND OPERATIONAL AMPLIFIER CIRCUIT

(75) Inventor: Kohei Toyotaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/453,092

(22) Filed: Apr. 23, 2012

(65) Prior Publication Data

US 2012/0274386 A1   Nov. 1, 2012

(30) Foreign Application Priority Data

Apr. 28, 2011   (JP) ................. 2011-101940

(51) Int. Cl.
*H03K 5/00* (2006.01)
*G06F 7/64* (2006.01)

(52) U.S. Cl.
USPC ............... 327/94; 327/95; 327/337; 327/344; 327/345

(58) Field of Classification Search
USPC ................. 327/94, 95, 337, 344, 345
See application file for complete search history.

(56) References Cited

U.S. PATENT DOCUMENTS

| | | | |
|---|---|---|---|
| 5,617,093 A * | 4/1997 | Klein | ............... 341/172 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,072,193 B2 | 7/2006 | Lin | |
| 7,105,868 B2 | 9/2006 | Nause et al. | |
| 7,211,825 B2 | 5/2007 | Shih et al | |
| 7,282,782 B2 | 10/2007 | Hoffman et al. | |

(Continued)

FOREIGN PATENT DOCUMENTS

EP   1 737 044 A1   12/2006
EP   2 226 847 A2   9/2010

(Continued)

OTHER PUBLICATIONS

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Kenneth B. Wells
(74) *Attorney, Agent, or Firm* — Fish & Richardson P.C.

(57) ABSTRACT

A semiconductor circuit which can have stable input output characteristics is provided. Specifically, a semiconductor circuit in which problems caused by the leakage current of a switching element are suppressed is provided. A field-effect transistor in which a wide band gap semiconductor, such as an oxide semiconductor, is used in a semiconductor layer where a channel is formed is used for a switching element included in a switched capacitor circuit. Such a transistor has a small leakage current in an off state. When the transistor is used as a switching element, a semiconductor circuit which has stable input output characteristics and in which problems caused by the leakage current are suppressed can be fabricated.

5 Claims, 11 Drawing Sheets

(56) References Cited

U.S. PATENT DOCUMENTS

| | | | |
|---|---|---|---|
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,626,524 B2 * | 12/2009 | Horie | 341/141 |
| 7,674,650 B2 | 3/2010 | Akimoto et al. | |
| 7,724,041 B2 * | 5/2010 | Draxelmayr | 327/91 |
| 7,732,819 B2 | 6/2010 | Akimoto et al. | |
| 7,791,074 B2 | 9/2010 | Iwasaki | |
| 7,834,685 B1 * | 11/2010 | Pertijs | 330/9 |
| 8,040,264 B2 * | 10/2011 | Hummerston et al. | 341/118 |
| 8,076,948 B2 * | 12/2011 | Knoedgen et al. | 324/658 |
| 8,368,430 B2 * | 2/2013 | Watanabe | 327/96 |
| 8,437,165 B2 * | 5/2013 | Yamazaki et al. | 365/72 |
| 8,471,256 B2 * | 6/2013 | Yamazaki et al. | 257/59 |
| 8,497,746 B2 * | 7/2013 | Visconti et al. | 333/173 |
| 8,502,226 B2 * | 8/2013 | Kondo et al. | 257/59 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0089927 A1 | 4/2011 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-301800 A | 10/1994 |
| JP | 08-264794 A | 10/1996 |
| JP | 11-505377 A | 5/1999 |
| JP | 11-234088 A | 8/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

(56) References Cited

OTHER PUBLICATIONS

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Razavi, B, "Design of Analog CMOS Integrated Circuits," Chapter 12.1 Introduction to Switched-Capacitor Circuits: General Considerations, Aug. 15, 2000, pp. 405-409.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,$YbFe_2O_4$, and $Yb_2Fe_3O_7$ Types of Structures for Compounds in the $In_2O_3$ and $Sc_2O_3$—$A_2O_3$—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

(56) References Cited

OTHER PUBLICATIONS

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

\* cited by examiner c-axis direction charge 0 charge +1 charge 0 ab plane charge −1 charge 0

● In
☾ Sn
☾ Zn
● O

- In
- Ga
- Zn
- O

SEMICONDUCTOR CIRCUIT HAVING SWITCHING ELEMENT, CAPACITOR, AND OPERATIONAL AMPLIFIER CIRCUIT

BACKGROUND OF THE INVENTION

1. Field of the Invention

The present invention relates to a semiconductor circuit using a semiconductor element.

2. Description of the Related Art

As one of techniques of a semiconductor circuit, a technique of a switched capacitor circuit has been known in which a switching element (hereinafter also referred to as a switch) is combined with a capacitor and the switching element controls charge and discharge of the capacitor. Since temperature dependence of the electric characteristics of such a switched capacitor circuit is very small, the switched capacitor circuit can be replaced with a resistor in a semiconductor circuit to fabricate a semiconductor circuit having small temperature dependence.

In addition, a technique of using a combination of a switched capacitor circuit and an operational amplifier circuit has been known. When such a semiconductor circuit including a combination of a switched capacitor circuit and an operational amplifier circuit is operated with the use of a clock signal, the semiconductor circuit samples a continuous time signal, which is input to the semiconductor circuit, converts the continuous time signal into a discrete time signal, and outputs the discrete time signal. Depending on the connection method and the operation method, a switched capacitor circuit and an operational amplifier circuit can constitute a circuit such as a filter circuit, an amplifier circuit, an integrating circuit, and a differentiating circuit.

For example, an amplifier (amp) including a combination of these is called a switched capacitor amplifier circuit (see Non-Patent Document 1).

FIG. 11 shows an example of a structure of a switched capacitor amplifier circuit described in Non-Patent Document 1. The switched capacitor amplifier circuit includes three switches (a switch SW1, a switch SW2, and a switch SW3), two capacitors (a capacitor C1 and a capacitor C2), and one operational amplifier circuit. An input signal IN is input to an input terminal of the switched capacitor amplifier circuit. An output signal OUT is output to an output terminal. Here, the voltage of the input signal IN is an input voltage Vin and the voltage of the output signal OUT is an output voltage Vout. The same clock signals S1 are input to the switch SW1 and the switch SW2, and a clock signal S2 having a phase opposite to that of the clock signal S1 is input to the switch SW3. Here, a ground voltage is Vref. A node between the switch SW1 and the capacitor C1 is called a node (A), and a node connected to a minus terminal of the operational amplifier circuit is called a node (B).

There are two periods in the operation of the switched capacitor amplifier circuit, that is, a sampling period during which the input voltage Vin is sampled and a hold period during which the sampled input voltage Vin is amplified and output as the output voltage Vout. As an example, operation of the switched capacitor amplifier circuit shown in FIG. 11 in each period will be described below.

First, in the sampling period, the clock signals S1 and the clock signal S2 are input to turn on the switch SW1 and the switch SW2 and turn off the switch SW3. At this time, when the capacitance of the capacitor C1 is C1, the capacitance of the capacitor C2 is C2, a charge accumulated in an electrode of the capacitor C1 on the node (B) side is Q1, and a charge accumulated in an electrode of the capacitor C2 on the node (B) side is Q2, Q1 and Q2 are expressed by a formula 1.

$$Q1 = C1 \times (Vref - Vin)$$

$$Q2 = C2 \times (Vref - Vref) = 0 \qquad \text{[Formula 1]}$$

Next, in the hold period, the clock signals S1 and the clock signal S2 are input to turn off the switch SW1 and the switch SW2 and to turn on the switch SW3. At this time, the potential of the node (B) does not change because the node (B) is virtually grounded by the operational amplifier circuit. Therefore, when a charge accumulated in an electrode of the capacitor C1 on the node (B) side at this time is Q1' and a charge accumulated in an electrode of the capacitor C2 on the node (B) side at this time is Q2', Q1' and Q2' are expressed by a formula 2.

$$Q1' = C1 \times (Vref - Vref) = 0$$

$$Q2' = C2 \times (Vref - Vout) \qquad \text{[Formula 2]}$$

Here, the output voltage Vout is expressed by a formula 3 when it is calculated on the assumption that the total amount of charges accumulated in the capacitors in the sampling period is equal to that in the hold period.

$$Vout = \frac{C1}{C2}(Vin - Vref) + Vref \qquad \text{[Formula 3]}$$

As described above, in the switched capacitor amplifier circuit, the input voltage Vin obtained in the sampling period can be amplified depending on the capacitance ratio between the capacitor C1 and the capacitor C2 and can be output in the hold period.

REFERENCE

Non-Patent Document

[Non-Patent Document 1] "Design of Analog CMOS Integrated Circuits (Application)", Behzad Razavi (supervised and translated by Tadahiro Kuroda), MARUZEN PUBLISHING CO., LTD (2003), pp. 495-498.

SUMMARY OF THE INVENTION

In many cases, a conventional analogue switch using a CMOS technique is used as a switch included in a switched capacitor circuit of the above semiconductor circuit. However, a leakage current is generated even in an off state of such an analogue switch, so that the input output characteristics of the semiconductor circuit are degraded owing to this leakage current in some cases. For example, there are the following problems in output characteristics caused by the leakage current in the above-described conventional switched capacitor amplifier circuit.

First, attention is focused on the switch SW1. The input voltage Vin is constantly input to the input terminal to which the input signal IN is input; therefore, when a leakage current is generated in the switch SW1 in an off state, the potential of the node (B) is not stable in the hold period. Consequently, noise due to the input voltage Vin is added to the output voltage Vout.

Next, attention is focused on the switch SW2. A charge accumulated in the capacitor C2 in the hold period decreases because the switch SW2 serves as a leakage path. As a result, the decrease of the charge is observed as a change in the output voltage Vout, so that the output voltage Vout cannot be stable.

In order to reduce such an influence of leakage currents of the switches included in the switched capacitor amplifier circuit, capacitance of the capacitor C1 and the capacitor C2 are increased. However, such a countermeasure leads to problems in that the layout size of the circuit is increased, and the circuit is incapable of high-speed operation since long time is required for charging and discharging the capacitor.

Occurrence of such problems caused by the leakage current of a switching element are not limited to the switched capacitor amplifier circuit described as an example in the above, and for example, the problems occur also in a semiconductor circuit including a combination of a switched capacitor circuit and an operational amplifier circuit, such as an amplifier circuit, an integrating circuit, or a filter circuit.

That is, noise is added to a discrete time signal that is an output signal owing to the leakage current of the switching element connected to a terminal to which a continuous time signal is input as an input signal of the semiconductor circuit. Further, a stable output voltage as an output signal cannot be obtained because of the leakage current of the switching element connected to the capacitor.

The present invention is made in view of the foregoing technical background. Therefore, an object of one embodiment of the present invention is to provide a semiconductor circuit with stable input output characteristics. Specifically, an object is to provide a semiconductor circuit with which fewer problems due to a leakage current of a switching element arise.

An embodiment of the present invention achieves at least one of the above objects.

In one embodiment of the present invention, a switching element having extremely small leakage current in an off state is used for a semiconductor circuit to solve the problems. Specifically, a field-effect transistor in which a wide band gap semiconductor, such as an oxide semiconductor, is used in a semiconductor layer where a channel is formed is used for the switching element. Such a transistor has a small leakage current in an off state. When the transistor is used as a switching element, a semiconductor circuit in which problems caused by the leakage current are suppressed and which has stable input output characteristics can be fabricated.

In addition, an oxide semiconductor having extremely low intrinsic carrier density is preferably used as a semiconductor included in the transistor. Since the intrinsic carrier density of the semiconductor layer where the channel is formed is extremely low, the leakage current of the transistor in an off state is extremely small. Such a feature is unique to an oxide semiconductor and other semiconductors (e.g., silicon) do not have such a feature.

One embodiment of the present invention is a semiconductor circuit including at least one switched capacitor circuit having a switching element and a capacitor connected in parallel or series to each other, and an operational amplifier circuit. The semiconductor circuit samples an input signal and outputs a discrete time signal. The switching element includes a field-effect transistor whose leakage current in an off state is less than or equal to $1 \times 10^{-17}$ A per channel width of 1 µm.

In the semiconductor circuit with the above structure, a transistor having extremely small off-state current and including an oxide semiconductor is used for the switching element of the switched capacitor circuit included in the semiconductor circuit. Thus, a decrease in charges accumulated in the capacitor connected to the switching element through the switching element in an off state is suppressed. Consequently, the semiconductor circuit including such a switched capacitor circuit can have stable input output characteristics. Extremely stable input output characteristics obtained by using such a transistor having extremely small leakage current in an off state cannot be obtained by a conventional transistor using silicon.

Further, one embodiment of the present invention is a semiconductor circuit including: an operational amplifier circuit; a first switching element connected to one input terminal of the operational amplifier circuit through a first capacitor; a second capacitor connected between the one input terminal and an output terminal of the operational amplifier circuit; a second switching element connected between the one input terminal and the output terminal of the operational amplifier circuit; and a third switching element including one electrode connected between the first switching element and the first capacitor and the other electrode to which a reference voltage is input. The reference voltage is input to the other input terminal of the operational amplifier circuit. The first switching element and the second switching element each include a field-effect transistor whose leakage current in an off state is less than or equal to $1 \times 10^{-17}$ A per channel width of 1 µm.

With such a structure, input of noise to an output signal, which is output during a hold period, due to an input signal is greatly suppressed, so that the switched capacitor amplifier circuit can have stable input output characteristics. Further, a decrease in charges accumulated in the second capacitor during the hold period is suppressed, so that change in output characteristics over time is suppressed.

Further, one embodiment of the present invention is a semiconductor circuit including: an operational amplifier circuit; a first switching element connected to one input terminal of the operational amplifier circuit through a first capacitor; a second capacitor connected between the one input terminal and an output terminal of the operational amplifier circuit; a second switching element connected between the one input terminal and the output terminal of the operational amplifier circuit; a third switching element connected to the other input terminal of the operational amplifier circuit through a third capacitor; a fourth capacitor connected between the other input terminal and the output terminal of the operational amplifier circuit; and a fourth switching element connected between the other input terminal and the output terminal of the operational amplifier circuit. The first switching element, the second switching element, the third switching element, and the fourth switching element each include a field-effect transistor whose leakage current in an off state is less than or equal to $1 \times 10^{-17}$ A per channel width of 1 µm.

With such a structure, a differential switched capacitor amplifier circuit which has stable input output characteristics and in which a reference voltage is unnecessary can be fabricated. Since the reference voltage is unnecessary, another circuit for generating the reference voltage is not needed; thus, a structure of a semiconductor device using the switched capacitor amplifier circuit can be simple.

Furthermore, one embodiment of the present invention is a semiconductor circuit including: an operational amplifier circuit; a first switching element connected to one input terminal of the operational amplifier circuit; a second switching element connected to the first switching element through a first capacitor; a second capacitor connected between the one input terminal and an output terminal of the operational amplifier circuit; a third switching element including one electrode connected between the first capacitor and the second switching element and the other electrode to which a reference voltage is input; and a fourth switching element including one electrode connected between the first capacitor and the first switching element and the other electrode to which the reference voltage is input. The reference voltage is input to the other input terminal of the operational amplifier circuit. The first switching element and the second switching element each include a field-effect transistor whose leakage current in an off state is less than or equal to $1\times10^{-17}$ A per channel width of 1 μm.

With such a structure, input of noise to an output signal, which is output during a hold period, due to an input signal is greatly suppressed, so that a switched capacitor integrating circuit with stable input output characteristics can be provided.

Further, the field-effect transistor preferably includes an oxide semiconductor in a semiconductor layer in which a channel is formed.

Note that in this specification and the like, a switched capacitor circuit includes at least one switching element and at least one capacitor, which are connected in parallel or series to each other, and is a circuit in which charge and discharge of the capacitor is controlled by a switching operation of the switching element.

According to one embodiment of the present invention, a semiconductor circuit which can have stable input output characteristics can be provided. Specifically, a semiconductor circuit in which problems caused by a leakage current of a switching element are suppressed can be provided.

DETAILED DESCRIPTION OF THE INVENTION

Figure 1:
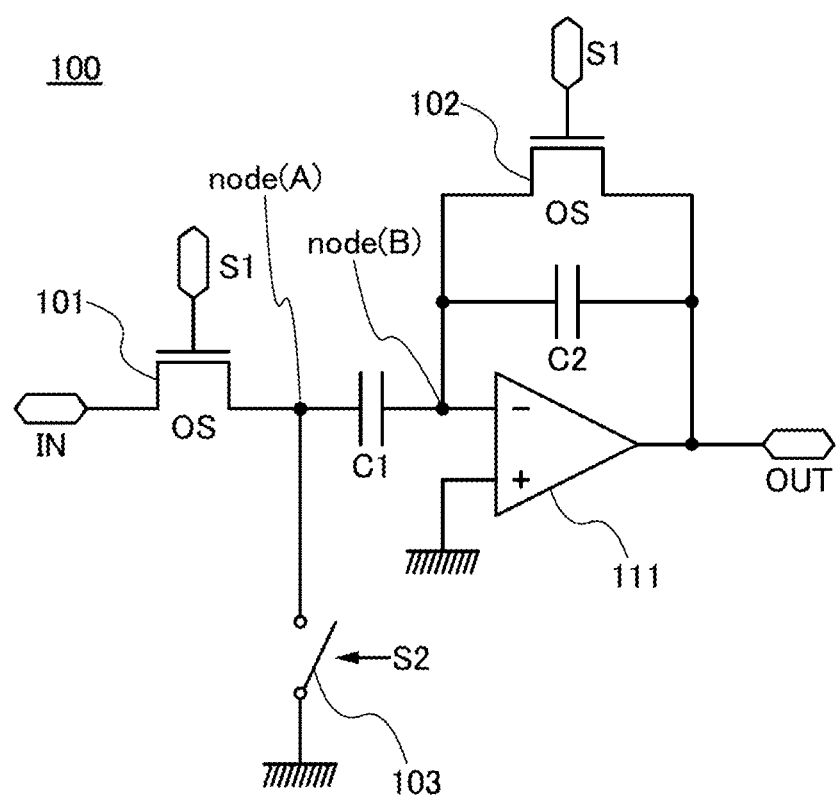
FIG. 1 shows a semiconductor circuit that is one embodiment of the present invention.

Embodiments will be described in detail with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Each object therefore is not necessarily in such scales.

A transistor is a kind of semiconductor elements and capable of amplifying a current or a voltage or switching operation for controlling conduction or non-conduction, or the like. A transistor in this specification includes an insulated-gate field effect transistor (IGFET) and a thin film transistor (TFT).

Functions of a "source" and a "drain" are sometimes replaced with each other when a transistor of opposite polarity is used or when the direction of current flow is changed in circuit operation, for example. Therefore, the terms "source" and "drain" can be used to denote the drain and the source, respectively, in this specification.

In this specification and the like, one of a source and a drain of a transistor is called a "first electrode" and the other of the source and the drain is called a "second electrode" in some cases. Note that a gate is called a "gate" or a "gate electrode" in such a case.

In this specification and the like, the term "electrically connected" includes the case where components are connected through an "object having any electric function". There is no particular limitation on an "object having any electric function" as long as electric signals can be transmitted and received between components that are connected through the object. Examples of an "object having any electric action" include a switching element such as a transistor, a resistor, a coil, a capacitor, and an element with a variety of functions in addition to an electrode and a wiring.

A node in this specification and the like means an element (e.g., a wiring) which enables electric connection between elements included in a circuit. Therefore, a "node to which A is connected" is a wiring which is electrically connected to A and can be regarded as having the same potential as A. Note that even when one or more elements which enable electrical connection (e.g., switches, transistors, capacitors, inductors, resistors, or diodes) are inserted in a portion of the wiring, the wiring can be regarded as the "node to which A is connected" as long as it has the same potential as A.

Embodiment 1

In this embodiment, a structural example and a circuit operation of a semiconductor circuit that is one embodiment of the present invention will be described with reference to FIG. 1, FIG. 2, FIG. 3, and FIG. 4.

<Structural Example>

FIG. 1 shows a circuit diagram of a switched capacitor amplifier circuit 100 described as an example in this embodiment. The switched capacitor amplifier circuit 100 with this structure is an amplifier circuit which amplifies the voltage amplitude of a continuous time signal input as an input signal IN and outputs a discrete time signal as an output signal OUT.

The switched capacitor amplifier circuit 100 includes three switching elements (a transistor 101, a transistor 102, and a switch 103), two capacitors (a capacitor C1 and a capacitor C2), and an operational amplifier circuit 111.

A first electrode of the transistor 101 is connected to an input terminal to which the input signal IN is input, and a second electrode of the transistor 101 is connected to a first terminal of the capacitor C1 and a first electrode of the switch 103. A second terminal of the capacitor C1 is connected to a minus terminal of the operational amplifier circuit 111, a first terminal of the capacitor C2, and a first electrode of the transistor 102. A second electrode of the transistor 102 is connected to a second terminal of the capacitor C2, an output terminal of the operational amplifier circuit 111, and an output terminal of the switched capacitor amplifier circuit 100 to which an output signal OUT is output. A second electrode of the switch 103 and a plus terminal of the operational amplifier circuit 111 are grounded.

The operational amplifier circuit 111 is one of differential amplifier circuits that operate with a potential difference between two input terminals, and various kinds of operation amplifiers can be used, for example. The operational amplifier circuit 111 may include an n-channel transistor and a p-channel transistor.

Here, a node between the transistor 101 and the capacitor C1 is a node (A), and a node connected to the minus terminal of the operational amplifier circuit 111 is a node (B).

The same clock signals S1 are input to a gate of the transistor 101 and a gate of the transistor 102, and a clock signal S2 having a phase opposite to that of the clock signal S1 is input to the switch 103. Here, the high-level potential of each of the clock signals input to the gates of the transistors preferably has a value which turns on the transistors satisfactorily, i.e., a value with which the transistors operate in the linear region regardless of the input voltage. When the transistor is operated with such a voltage, drop of a voltage input through the transistor due to the influence of the threshold voltage of the transistor can be suppressed. Hereinafter description is made assuming that a voltage drop due to the threshold voltage of the transistor is negligible.

The transistors 101 and 102 are n-channel transistors.

Here, for example, a transistor using a semiconductor with a wider band gap than silicon in a semiconductor layer where a channel is formed can be used as each of the transistor 101 and the transistor 102. For example, a semiconductor with a band gap greater than or equal to 2.0 eV, preferably greater than or equal to 2.5 eV, more preferably greater than or equal to 3.0 eV can be used. An oxide semiconductor is preferably used as such a semiconductor.

The transistor including the oxide semiconductor has a small leakage current (hereinafter also referred to as an off-state current) in an off state. The off-state current per micrometer of channel width is lower than or equal to 10 aA ($1 \times 10^{-17}$ A), preferably lower than or equal to 1 aA ($1 \times 10^{-18}$ A), more preferably lower than or equal to 10 zA ($1 \times 10^{-20}$ A), further preferably lower than or equal to 1 zA ($1 \times 10^{-21}$ A), still further preferably lower than or equal to 100 yA ($1 \times 10^{-22}$ A).

A transistor using a known semiconductor material such as silicon can be used as the switch 103. Note that the switch 103 may be formed using a semiconductor material similar to those of the transistors 101 and 102. When the switch 103 is formed using a semiconductor material similar to those of the transistors 101 and 102, the manufacturing steps can be simple. Further, as described as an example in Embodiment 3, an area of the circuit can be reduced in such a manner that the switch 103 is formed using a semiconductor material such as silicon and the transistors 101 and 102 are formed over the switch 103.

<Example of Circuit Operation>

An example of a circuit operation of the switched capacitor amplifier circuit 100 will be described below with reference to FIG. 1 and FIG. 2. Note that part of the description, which is in common with the description of the related art is not repeated in some cases.

Here, there are two periods, i.e., a sampling period and a hold period in the operation of the switched capacitor amplifier circuit 100. In the sampling period, the switched capacitor amplifier circuit 100 samples an input voltage Vin of the input signal IN. In the hold period, the switched capacitor amplifier circuit 100 can output the output signal OUT having an output voltage Vout, which is amplified based on an amplifier ratio determined by the capacitance ratio between the capacitor C1 and the capacitor C2.

Figure 2:
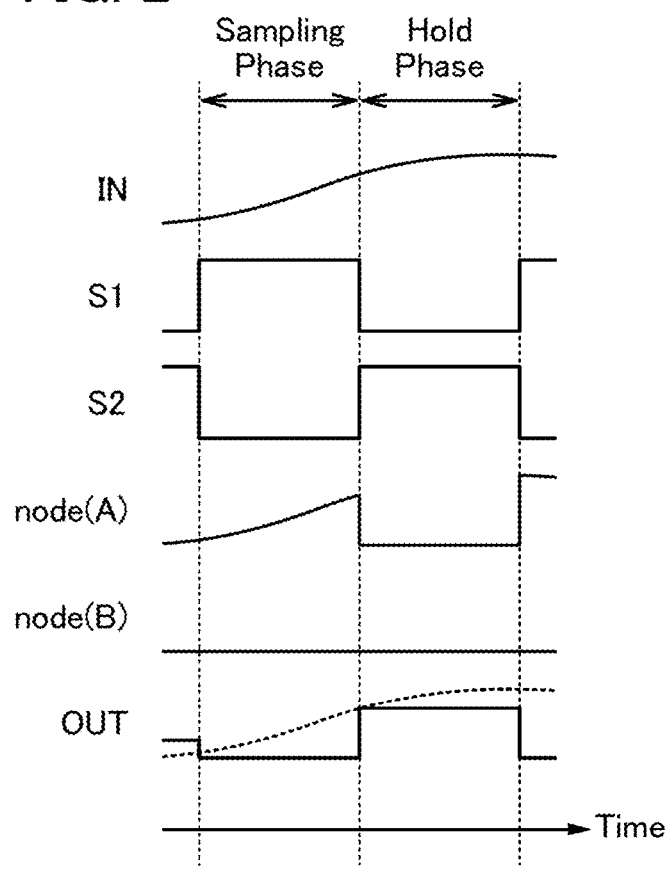
FIG. 2 shows an operation of a semiconductor circuit that is one embodiment of the present invention.

FIG. 2 is an example of a timing chart of the circuit operation of the switched capacitor amplifier circuit 100. FIG. 2 shows a change over time in the voltage of each of the input signal IN, the clock signal S1, the clock signal S2, the node (A), the node (B), and the output signal OUT, which are shown in FIG. 1.

Here, a switch described in this specification and the like turns on when a high-level potential is input as a clock signal and turns off when a low-level potential is input as a clock signal.

First, in the sampling period, a high-level potential is input as the clock signal S1 and a low-level potential is input as the clock signal S2. That is, in the sampling period, the transistors 101 and 102 are turned on and the switch 10 is turned off.

Thus, in the sampling period, the input voltage Vin is input to the node (A) through the transistor 101. On the other hand, the potential of the node (B) and the potential of the output signal OUT are both grounded.

Next, in the hold period, a low-level potential is input as the clock signal S1 and a high-level potential is input as the clock signal S2. That is, in the hold period, the transistors 101 and 102 are turned off and the switch 103 is turned on.

Thus, in the hold period, a ground potential is input to the node (A) through the switch 103. The node (B) is virtually grounded, so that the node (B) holds a ground potential. The output voltage Vout obtained by amplifying the input voltage Vin, which is in the state just before the hold period, based on the capacitance ratio between the capacitor C1 and the capacitor C2 is output as the output signal OUT.

Here, when attention is focused on the transistor 101 in the hold period, although the input voltage Vin is constantly input from a terminal which is connected to the first electrode of the transistor 101 and to which the input signal IN is input, the node (A) and the input terminal are almost completely insulated from each other because the off-state current of the transistor 101 is extremely small. Thus, input of amplitude of the input voltage Vin as noise to the node (A) is greatly suppressed, so that the potential of the node (A) is kept stable. Therefore, the potential of the node (B) which is capacitively coupled with the node (A) through the capacitor C1 is also kept stable; consequently, the output signal OUT can have the stable output voltage Vout.

When attention is focused on the transistor 102 in the hold period, similarly to the capacitor C2, the transistor 102 is kept in the state where the voltage of the output voltage Vout is applied between the first electrode and the second electrode. Here, since the off-state current of the transistor 102 is extremely small, the output terminal of the switched capacitor amplifier circuit 100 to which the output signal OUT is output and the node (B) are almost completely insulated from each other, and the potential of the output voltage Vout is kept extremely stable.

Consequently, with such a structure, problems caused by the leakage current of the switching element can be suppressed, and the switched capacitor amplifier circuit 100 can have stable input output characteristics.

Further, in a conventional switched capacitor amplifier circuit, in consideration of the off-state current of a switching element connected to the capacitor C2 in parallel, capacitance of each of the capacitor C1 and the capacitor C2 needs to be designed to be large in advance in order to stabilize the output voltage Vout. However, in the switched capacitor amplifier circuit 100 with this structure, a capacitor with extremely small capacitance can be used for each of the capacitor C1 and the capacitor C2 because the off-state current of the transistor 102 connected to the capacitor C2 in parallel is extremely small. Further, for example, it is possible to utilize capacitance between wirings, in which case another capacitor is unnecessary. Thus, the layout size of a switched capacitor amplifier circuit including the above-described transistor with extremely small off-state current can be small compared to the conventional switched capacitor amplifier circuit.

MODIFICATION EXAMPLE 1

A structural example of a circuit different from that described as an example in the above will be described below.

Figure 3:
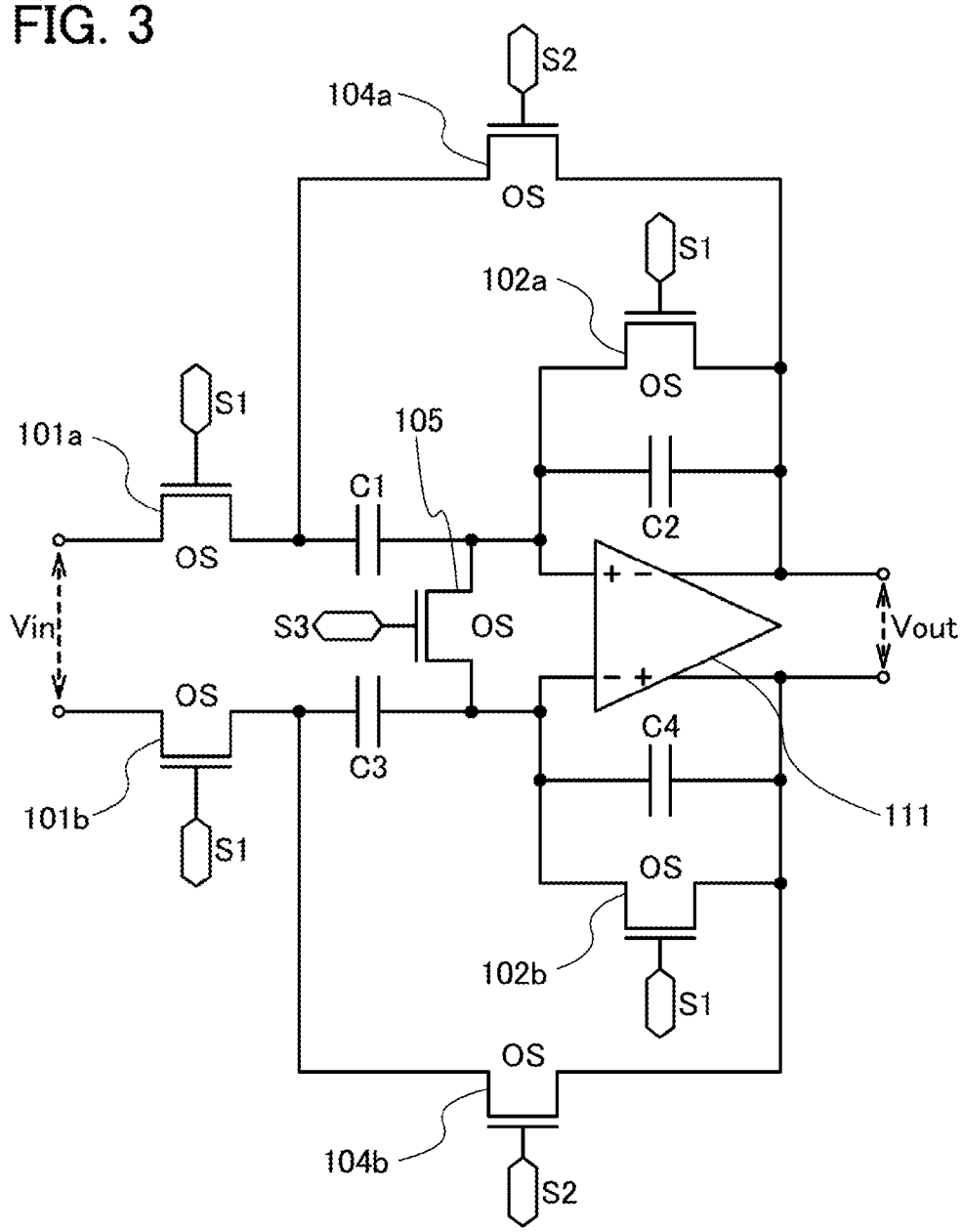
FIG. 3 shows a semiconductor circuit that is one embodiment of the present invention.

A switched capacitor amplifier circuit shown in FIG. 3 is a differential switched capacitor amplifier circuit which does not use a reference potential (ground voltage).

A second electrode of a transistor 101a is connected to a plus terminal of the operational amplifier circuit 111 through the capacitor C1. Further, the plus terminal and a minus output terminal of the operational amplifier circuit 111 are each connected in parallel to the capacitor C2 and a transistor 102a. A first electrode of a transistor 104a is connected to a node between the transistor 101a and the capacitor C1, and a second electrode of the transistor 104a is connected to the minus output terminal of the operational amplifier circuit 111.

Further, a minus terminal of the operational amplifier circuit 111 is connected to a second electrode of a transistor 101b through a capacitor C3. The minus terminal and a plus output terminal of the operational amplifier circuit 111 are each connected in parallel to a capacitor C4 and a transistor 102b. A first electrode of a transistor 104b is connected to a node between the transistor 101b and the capacitor C3, and a second electrode of the transistor 104b is connected to the plus output terminal of the operational amplifier circuit 111.

Further, a first electrode and a second electrode of a transistor 105 are connected to a node between the capacitor C1 and the operational amplifier circuit 111 and a node between the capacitor C3 and the operational amplifier circuit 111, respectively.

An input signal is input between a node to which a first electrode of the transistor 101a is connected and a node to which a first electrode of the transistor 101b is connected so that the potential difference therebetween becomes the input voltage Vin. Further, the potential difference between the minus output terminal and the plus output terminal of the operational amplifier circuit 111 becomes the output voltage Vout.

Here, the clock signal S1 is input to a gate of each of the transistor 101a, the transistor 101b, the transistor 102a, and the transistor 102b. Further, the clock signal S2 is input to a gate of each of the transistor 104a and the transistor 104b. A clock signal S3 is input to a gate of the transistor 105.

Here, the transistor 105 is provided to serve a function of resetting the potentials of the plus terminal and the minus terminal in the operational amplifier circuit 111 so that both the terminals have the same potentials, and a reset period during which the potentials are reset is controlled by the clock signal S3.

A period during which a high-level potential is input as the clock signal S1 is a sampling period and a period during which a high-level potential is input as the clock signal S2 is a hold period. A period during which a high-level potential is input as the clock signal S3 is a reset period. Here, it is sufficient that the reset period is set so as not to overlap with the hold period, and the reset period may be set just before the sampling period and may be set so as to overlap with the sampling period.

With a differential switched capacitor amplifier circuit having such a structure, offset voltage due to variation in the electric characteristics of transistors can be reduced, so that input output characteristics with high accuracy can be obtained.

Here, in this structure, the transistor with extremely small off-state current described as an example in the above is used as each of the transistor 101a, the transistor 101b, the transistor 102a, the transistor 102b, the transistor 104a, the transistor 104b, and the transistor 105. Consequently, problems caused by the leakage current of the switching element in the switched capacitor amplifier circuit having this structure are solved and stable input output characteristics can be obtained.

MODIFICATION EXAMPLE 2

A structure including a combination of the transistor with extremely small off-state current described as an example in the above, a capacitor, and an operational amplifier circuit can be used for a semiconductor circuit such as a filter circuit or an integrating circuit in addition to an amplifier circuit such as a switched capacitor amplifier circuit. The case of using the transistor with extremely small off-state current described as an example in the above for a switched capacitor integrating circuit will be described below.

Figure 4:
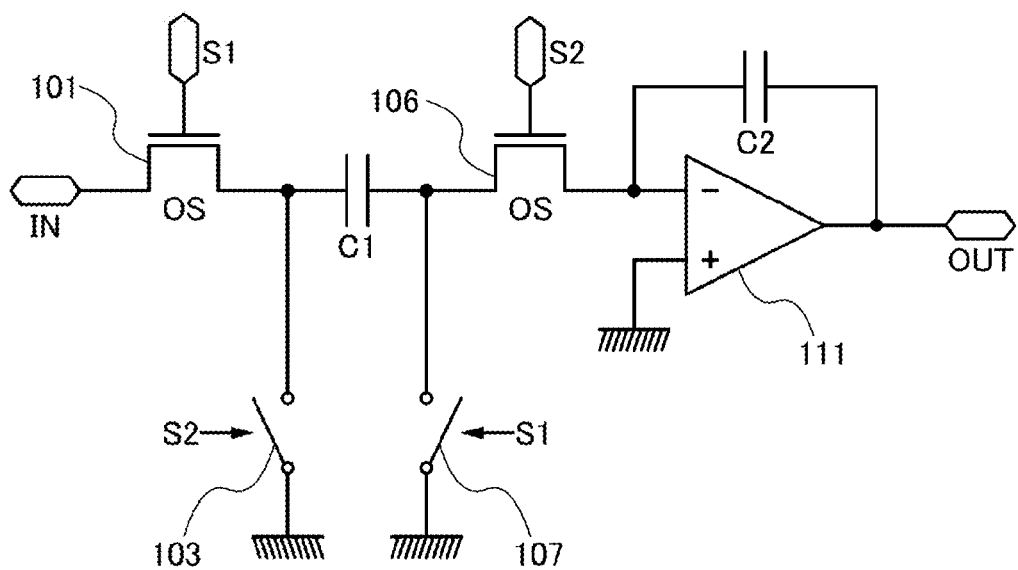
FIG. 4 shows a semiconductor circuit that is one embodiment of the present invention.

FIG. 4 shows a structure of a switched capacitor integrating circuit described as an example.

A structure of the switched capacitor integrating circuit shown in FIG. 4 is a structure in which the transistor 102 is removed from and a transistor 106 and a switch 107 are added to the structure of the switched capacitor amplifier circuit described as an example in FIG. 1.

The transistor 106 is connected in series between the capacitor C1 and the operational amplifier circuit 111. Further, a first electrode of the switch 107 is connected to a node between the capacitor C1 and the transistor 106 and a second electrode of the switch 107 is grounded.

The transistor 101 and the switch 107 are controlled by the clock signal S1. On the other hand, the transistor 106 and the switch 103 are controlled by the clock signal S2 having a phase opposite to that of the clock signal S1. Here, a period during which the transistor 101 and the switch 107 are turned on by the clock signal S1 is a sampling period, and a period during which the transistor 106 and the switch 103 are turned on by the clock signal S2 is a hold period.

In the sampling period, a charge based on the input voltage Vin is accumulated in the capacitor C1. Next, when the sampling period is shifted to the hold period, the charge accumulated in the capacitor C1 moves to the capacitor C2 through the transistor 106; thus, voltages (which correspond to the output voltage Vout) applied to both terminals of the capacitor C2 are changed on the basis of the charge. Then, when the hold period is shifted to the sampling period, the transistor 106 is turned off, so that the charge accumulated in the capacitor C2 is held and a value of the output voltage Vout is kept at a value in the hold period just before the sampling period. In such a manner, the output voltage Vout obtained by integrating the input voltage Vin which is input to the input terminal is output to an output terminal.

Here, the transistor with extremely small off-state current described as an example in the above is used as each of the transistor 101 and the transistor 106.

Thus, in the sampling period, with the transistor 106, the operational amplifier circuit 111 and the capacitor C2 are almost completely insulated from the capacitor C1 to which the input voltage Vin is input, whereby input of noise to the output signal OUT due to the input signal IN is greatly suppressed and a stable output signal can be obtained. Further, in the hold period, the input signal IN and the capacitor C1 are almost completely insulated from each other with the transistor 101, so that input of noise to the output signal OUT due to the input signal is greatly suppressed and a stable output signal can be obtained.

As described above, in a semiconductor circuit including a combination of an operational amplifier and a switched capacitor circuit in which the transistor with extremely small off-state current described as an example in the above and a capacitor are connected to each other in series or parallel, problems caused by the leakage current of a switching element are suppressed and stable input output characteristics can be obtained.

This embodiment can be combined with any of the other embodiments disclosed in this specification as appropriate.

Embodiment 2

In this embodiment, examples of a transistor including an oxide semiconductor layer which can be used for the semiconductor circuit in the above embodiment will be described.

Structural examples of the transistor including the oxide semiconductor layer will be described with reference to FIGS. 5A to 5D. FIGS. 5A to 5D are schematic cross-sectional views each illustrating a structural example of the transistor in this embodiment.

Figure 5A:
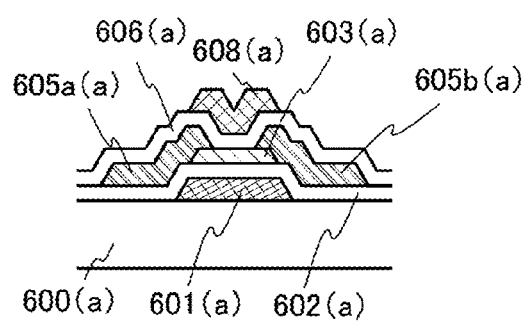
FIGS. 5A to 5D each show a structure of a transistor that is one embodiment of the present invention.

A transistor shown in FIG. 5A includes a conductive layer 601 (a), an insulating layer 602 (a), a semiconductor layer 603 (a), a conductive layer 605a (a), a conductive layer 605b (a), an insulating layer 606 (a), and a conductive layer 608 (a).

The conductive layer 601 (a) is provided over an element formation layer 600 (a).

The insulating layer 602 (a) is provided over the conductive layer 601 (a).

The semiconductor layer 603 (a) overlaps with the conductive layer 601 (a) with the insulating layer 602 (a) provided therebetween.

The conductive layer 605a (a) and the conductive layer 605b (a) are each provided over the semiconductor layer 603 (a) and electrically connected to the semiconductor layer 603 (a).

The insulating layer 606 (a) is provided over the semiconductor layer 603 (a), the conductive layer 605a (a), and the conductive layer 605b (a).

The conductive layer 608 (a) overlaps with the semiconductor layer 603 (a) with the insulating layer 606 (a) provided therebetween.

Note that one of the conductive layer 601 (a) and the conductive layer 608 (a) is not necessarily provided. In the case where the conductive layer 608 (a) is not provided, the insulating layer 606 (a) is not necessarily provided.

Figure 5B:
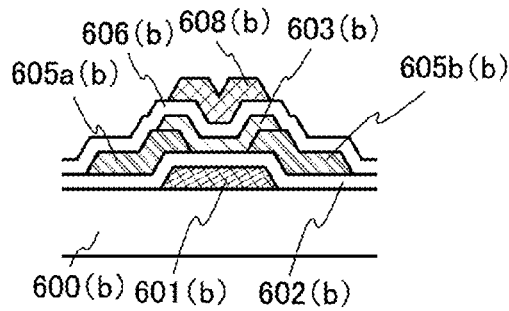

A transistor shown in FIG. 5B includes a conductive layer 601 (b), an insulating layer 602 (b), a semiconductor layer 603 (b), a conductive layer 605a (b), a conductive layer 605b (b), an insulating layer 606 (b), and a conductive layer 608 (b).

The conductive layer 601 (b) is provided over an element formation layer 600 (b).

The insulating layer 602 (b) is provided over the conductive layer 601 (b).

The conductive layer 605a (b) and the conductive layer 605b (b) are each provided over part of the insulating layer 602 (b).

The semiconductor layer 603 (b) is provided over the conductive layer 605a (b) and the conductive layer 605b (b) and electrically connected to the conductive layer 605a (b) and the conductive layer 605b (b). Further, the semiconductor layer 603 (b) overlaps with the conductive layer 601 (b) with the insulating layer 602 (b) provided therebetween.

The insulating layer 606 (b) is provided over the semiconductor layer 603 (b), the conductive layer 605a (b), and the conductive layer 605b (b).

The conductive layer 608 (b) overlaps with the semiconductor layer 603 (b) with the insulating layer 606 (b) provided therebetween.

Note that one of the conductive layer 601 (b) and the conductive layer 608 (b) is not necessarily provided. In the case where the conductive layer 608 (b) is not provided, the insulating layer 606 (b) is not necessarily provided.

Figure 5C:
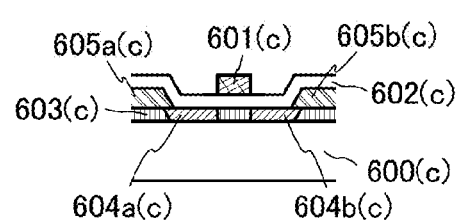

A transistor shown in FIG. 5C includes a conductive layer 601 (c), an insulating layer 602 (c), a semiconductor layer 603 (c), a conductive layer 605a (c), and a conductive layer 605b (c).

The semiconductor layer 603 (c) includes a region 604a (c) and a region 604b (c). The region 604a (c) and the region 604b (c) are separated from each other and a dopant is added to each of the regions. A region between the region 604a (c) and the region 604b (c) serves as a channel formation region. The semiconductor layer 603 (c) is provided over an element formation layer 600 (c). Note that the region 604a (c) and the region 604b (c) are not necessarily provided.

The conductive layer 605a (c) and the conductive layer 605b (c) are provided over the semiconductor layer 603 (c) and electrically connected to the semiconductor layer 603 (c). Side surfaces of the conductive layer 605a (c) and the conductive layer 605b (c) are tapered.

The conductive layer 605a (c) overlaps with part of the region 604a (c); however, the present invention is not necessarily limited to this. When the conductive layer 605a (c) partly overlaps with the region 604a (c), resistance between the conductive layer 605a (c) and the region 604a (c) can be low. Further, an entire region in the semiconductor layer 603 (c), which overlaps with the conductive layer 605a (c) may be the region 604a (c).

The conductive layer 605b (c) overlaps with part of the region 604b (c); however, the present invention is not limited to this. When the conductive layer 605b (c) partly overlaps with the region 604b (c), resistance between the conductive layer 605b (c) and the region 604b (c) can be low. Further, an entire region in the semiconductor layer 603 (c), which overlaps with the conductive layer 605b (c) may be the region 604b (c).

The insulating layer 602 (c) is provided over the semiconductor layer 603 (c), the conductive layer 605a (c), and the conductive layer 605b (c).

The conductive layer 601 (c) overlaps with the semiconductor layer 603 (c) with the insulating layer 602 (c) provided therebetween. A region in the semiconductor layer 603 (c), which overlaps with the conductive layer 601 (c) with the insulating layer 602 (c) provided therebetween serves as the channel formation region.

Figure 5D:
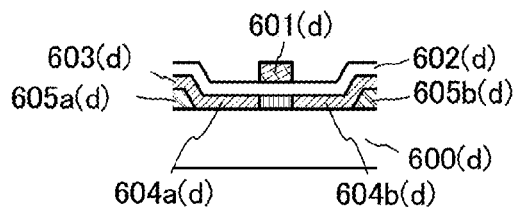

A transistor shown in FIG. 5D includes a conductive layer 601 (d), an insulating layer 602 (d), a semiconductor layer 603 (d), a conductive layer 605a (d), and a conductive layer 605b (d).

The conductive layer 605a (d) and the conductive layer 605b (d) are provided over an element formation layer 600 (d). Side surfaces of the conductive layer 605a (d) and the conductive layer 605b (d) are tapered.

The semiconductor layer 603 (d) includes a region 604a (d) and a region 604b (d). The region 604a (d) and the region 604b (d) are separated from each other and a dopant is added to each of the regions. A region between the region 604a (d) and the region 604b (d) serves as a channel formation region. The semiconductor layer 603 (d) is provided over the conductive layer 605a (d), the conductive layer 605b (d), and the element formation layer 600 (d) and electrically connected to the conductive layer 605a (d) and the conductive layer 605b (d). Note that the region 604a (d) and the region 604b (d) are not necessarily provided.

The region 604a (d) is electrically connected to the conductive layer 605a (d).

The region 604b (d) is electrically connected to the conductive layer 605b (d).

The insulating layer 602 (d) is provided over the semiconductor layer 603 (d).

The conductive layer 601 (d) overlaps with the semiconductor layer 603 (d) with the insulating layer 602 (d) provided therebetween. A region in the semiconductor layer 603 (d), which overlaps with the conductive layer 601 (d) with the insulating layer 602 (d) provided therebetween serves as the channel formation region.

The components shown in FIGS. 5A to 5D will be described below.

As the element formation layers 600 (a) to 600 (d), insulating layers, substrates having insulating surfaces, or the like can be used, for example. Further, layers over which elements are formed in advance can be used as the element formation layers 600 (a) to 600 (d).

Each of the conductive layers 601 (a) to 601 (d) has a function of a gate of the transistor. Note that a layer having a function of a gate of the transistor can be called a gate electrode or a gate wiring.

As the conductive layers 601 (a) to 601 (d), a layer of a metal material such as molybdenum, magnesium, titanium, chromium, tantalum, tungsten, aluminum, copper, neodymium, or scandium or an alloy material containing any of these materials as a main component can be used, for example. Alternatively, the conductive layers 601 (a) to 601 (d) can be formed by stacking layers of any of materials that can be used for the conductive layers 601 (a) to 601 (d).

Each of the insulating layers 602 (a) to 602 (d) has a function of a gate insulating layer of the transistor.

Each of the insulating layers 602 (a) to 602 (d) can be, for example, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, or a lanthanum oxide layer. Each of the insulating layers 602 (a) to 602 (d) can be a stack of layers of any of materials that can be used for the insulating layers 602 (a) to 602 (d).

Alternatively, the insulating layers 602 (a) to 602 (d), an insulating layer of a material containing, for example, an element that belongs to Group 13 in the periodic table and oxygen can be used. When the semiconductor layers 603 (a) to 603 (d) contain an element that belongs to Group 13, the use of insulating layers each containing an element that belongs to Group 13 as insulating layers in contact with the semiconductor layers 603 (a) to 603 (d) makes the state of interfaces between the insulating layers and the oxide semiconductor layers favorable.

Examples of the material containing an element that belongs to Group 13 include gallium oxide, aluminum oxide, aluminum gallium oxide, and gallium aluminum oxide. Note that aluminum gallium oxide refers to a substance in which the amount of aluminum is larger than that of gallium in atomic percent, and gallium aluminum oxide refers to a substance in which the amount of gallium is larger than or equal to that of aluminum in atomic percent. As the insulating layers 602 (a) to 602 (d), a material represented by $Al_2O_x$ ($x=3+\alpha$, where $\alpha$ is larger than 0 and smaller than 1), $Ga_2O_x$ ($x=3+\alpha$, where $\alpha$ is larger than 0 and smaller than 1), or $Ga_xAl_{2-x}O_{3+\alpha}$ ($x$ is larger than 0 and smaller than 2 and $\alpha$ is larger than 0 and smaller than 1) can be used, for example.

Each of the insulating layers 602 (a) to 602 (d) can be a stack of layers of any of materials which can be used for the insulating layers 602 (a) to 602 (d). For example, the insulating layers 602 (a) to 602 (d) can be a stack of layers containing gallium oxide represented by $Ga_2O_x$. Alternatively, the insulating layers 602 (a) to 602 (d) may be a stack of layers of an insulating layer containing gallium oxide represented by $Ga_2O_x$ and an insulating layer containing aluminum oxide represented by $Al_2O_x$.

Each of the semiconductor layers 603 (a) to 603 (d) functions as a layer in which a channel of the transistor is formed. As an oxide semiconductor that can be used for the semiconductor layers 603 (a) to 603 (d), a metal oxide such as a four-component metal oxide, a three-component metal oxide, and a two-component metal oxide can be used, for example.

As the four-component metal oxide, an In—Sn—Ga—Zn—O-based metal oxide or the like can be used, for example.

As the three-component metal oxide, an In—Ga—Zn—O-based metal oxide, an In—Sn—Zn—O-based metal oxide, an In—Al—Zn—O-based metal oxide, a Sn—Ga—Z—O-based metal oxide, an Al—Ga—Zn—O-based metal oxide, a Sn—Al—Zn—O-based metal oxide, or the like can be used, for example.

As the oxide of two-component oxide, an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, an In—Sn—O-based metal oxide, or an In—Ga—O-based metal oxide can be used, for example.

Further, an In—O-based metal oxide, a Sn—O-based metal oxide, a Zn—O-based metal oxide, or the like can also be used as the oxide semiconductor. The metal oxide that can be used as the oxide semiconductor may contain silicon oxide.

In the case of using an In—Zn—O-based metal oxide, for example, an oxide target which has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 ($In_2O_3$:ZnO=15:2 to 3:4 in a molar ratio) can be used for forming a semiconductor layer of an In—Zn—O-based oxide. For example, when the atomic ratio of the target used for the formation of the In—Zn—O-based oxide semiconductor is expressed by In:Zn:O=S:U:R, R>1.5S+U. An increase in the amount of indium enables mobility of the transistor to increase.

As the oxide semiconductor, a material represented by $InLO_3 (ZnO)_m$ (m is larger than 0) can be used. Here, L in $InLO_3(ZnO)_m$ represents one or more metal elements selected from Ga, Al, Mn, or Co.

The oxide semiconductor is in a single crystal state, a polycrystalline (also referred to as polycrystal) state, an amorphous state, or the like.

At least a region of each of the semiconductor layers 603 (a) to 603 (d), in which the channel is formed may be crystalline and a non-single-crystal and include a phase which has a triangular, hexagonal, regular triangular, or regular hexagonal atomic arrangement when seen from the direction perpendicular to the a-b plane and in which metal atoms are arranged in a layered manner in the direction perpendicular to the c-axis direction or the metal atoms and oxygen atoms are arranged in a layered manner in the direction perpendicular to the c-axis direction. An oxide semiconductor including the above-described phase is also referred to as a c-axis aligned crystalline oxide semiconductor (CAAC-OS).

Further, when the channel length of the transistor is 30 nm, the thickness of each of the semiconductor layers 603 (a) to 603 (d) may be approximately 5 nm, for example. In this case, if the semiconductor layers 603 (a) to 603 (d) are CAAC oxide semiconductor layers, a short channel effect in the transistor can be suppressed.

The CAAC-OS will be described in detail in Embodiment 4.

A dopant imparting n-type or p-type conductivity is added to each of the region 604a (c), the region 604b (c), the region 604a (d), and the region 604b (d), and the region 604a (c), the region 604b (c), the region 604a (d), and the region 604b (d) each function as a source or a drain of the transistor. As the dopant, one or more of elements of Group 13 in the periodic table (e.g., boron) and elements of Group 15 in the periodic table (e.g., nitrogen, phosphorus, and arsenic) can be used. Note that a region functioning as the source of the transistor is also referred to as a source region, and a region functioning as the drain of the transistor is also referred to as a drain region. When the dopant is added to the region 604a (c), the region 604b (c), the region 604a (d), and the region 604b (d), the connection resistance between the regions and the conductive layers can be reduced, so that the transistor can be miniaturized.

The conductive layers 605a (a) to 605a (d) and the conductive layers 605b (a) to 605b (d) function as the source or the drain of the transistor. Note that a layer functioning as a source of the transistor is also referred to as a source electrode or a source wiring, and a layer functioning as a drain of the transistor is also referred to as a drain electrode or a drain wiring.

Each of the conductive layers 605a (a) to 605a (d) and the conductive layers 605b (a) to 605b (d) can be formed using, for example, a layer of a metal material such as aluminum, magnesium, chromium, copper, tantalum, titanium, molybdenum, or tungsten; or an alloy material which contains any of the above metal materials as a main component. For example, each of the conductive layers 605a (a) to 605a (d) and the conductive layers 605b (a) to 605b (d) can be formed using a stacked-layer structure including a layer of an alloy material containing copper, magnesium, and aluminum. Alternatively, each of the conductive layers 605a (a) to 605a (d) and the conductive layers 605b (a) to 605b (d) can be formed using a stacked-layer structure of any of materials that can be used for the conductive layers 605a (a) to 605a (d) and the conductive layers 605b (a) to 605b (d). For example, each of the conductive layers 605a (a) to 605a (d) and the conductive layers 605b (a) to 605b (d) can be formed using a stacked-layer structure including a layer of an alloy material containing copper, magnesium, and aluminum and a layer containing copper.

Further, a layer containing a conductive metal oxide can be used for each of the conductive layers 605a (a) to 605a (d) and the conductive layers 605b (a) to 605b (d). Examples of the conductive metal oxide include indium oxide, tin oxide, zinc oxide, indium oxide-tin oxide, and indium oxide-zinc oxide. Note that the conductive metal oxide that can be used for each of the conductive layers 605a (a) to 605a (d) and the conductive layers 605b (a) to 605b (d) may contain silicon oxide.

For each of the insulating layers 606 (a) and 606 (b), a layer of a material that can be used for the insulating layers 602 (a) to 602 (d) can be used. Alternatively, each of the insulating layers 606 (a) and 606 (b) can be formed using a stacked-layer structure of any of materials that can be used for the insulating layers 606 (a) and 606 (b). For example, each of the insulating layers 606 (a) and 606 (b) may be formed using a silicon oxide layer, an aluminum oxide layer, or the like. For example, with the use of an aluminum oxide layer, effect of preventing impurities from entering the semiconductor layers 603 (a) and 603 (b) can be further improved, and effect of preventing elimination of oxygen in the semiconductor layers 603 (a) and 603 (b) can also be improved.

Each of the conductive layers 608 (a) and 608 (b) functions as a gate of the transistor. Note that in the case where the transistor includes both the conductive layers 601 (a) and 608 (a) or both the conductive layers 601 (b) and 608 (b), one of the conductive layers 601 (a) and 608 (a) or one of the conductive layers 601 (b) and 608 (b) is referred to as a back gate, a back gate electrode, or a back gate wiring. A plurality of conductive layers each functioning as a gate are provided with the channel formation layer provided therebetween, whereby the threshold voltage of the transistor can be easily controlled.

As each of the conductive layers 608 (a) and 608 (b), a layer of a material that can be used for the conductive layers 601 (a) to 601 (d) can be used, for example. Each of the conductive layers 608 (a) and 608 (b) may be formed using a stacked-layer structure of any of materials that can be used for the conductive layers 608 (a) and 608 (b).

Note that the transistor of this embodiment may have a structure in which an insulating layer is provided over part of the oxide semiconductor layer functioning as a channel formation layer and a conductive layer functioning as a source or a drain is provided to overlap with the oxide semiconductor layer with the insulating layer interposed therebetween. In the case of the above structure, the insulating layer functions as a layer protecting the channel formation layer (also referred to as a channel protective layer) of the transistor. As the insulating layer functioning as a channel protective layer, a layer including a material that can be used for the insulating layers 602 (a) to 602 (d) can be used for example. Alternatively, an insulating layer functioning as a channel protective layer may be formed by stacking layers of any of materials that can be used for the insulating layers 602 (a) to 602 (d).

Further, a base layer may be formed over each of the element formation layers 600 (a) to 600 (d) and the transistor may be formed over the base layer. In this case, a layer of a material that can be used for the insulating layers 602 (a) to 602 (d) can be used as the base layer, for example. Alternatively, the base layer may be formed using a stacked-layer structure of any of materials that can be used for the insulating layers 602 (a) to 602 (d). For example, when the base layer is formed using a stacked-layer structure of an aluminum oxide layer and a silicon oxide layer, elimination of oxygen included in the base layer through the semiconductor layers 603 (a) to 603 (d) can be suppressed.

Next, as an example of a method for manufacturing the transistor in this embodiment, an example of a method for manufacturing the transistor shown in FIG. 5A will be described below with reference to FIGS. 6A to 6E. FIGS. 6A to 6E are schematic cross-sectional views showing an example of the method for manufacturing the transistor in FIG. 5A.

Figure 6A:
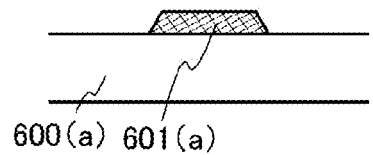
FIGS. 6A to 6E show a method for manufacturing a transistor that is one embodiment of the present invention.

First, as shown in FIG. 6A, the element formation layer 600 (a) is prepared, a first conductive film is formed over the element formation layer 600 (a), and part of the first conductive film is etched to form the conductive layer 601 (a).

A film of a material that can be used for the conductive layer 601 (a) is formed by a sputtering method, so that the first conductive film can be formed, for example. The first conductive film can be formed by stacking layers each formed of a material that can be used for the first conductive film.

When a high-purity gas from which impurities such as hydrogen, water, a hydroxyl group, and a hydride are removed is used as a sputtering gas, the concentration of the impurities in a film to be formed can be reduced.

Note that before the film is formed by a sputtering method, preheat treatment may be performed in a preheating chamber of a sputtering apparatus. With the preheat treatment, impurities such as hydrogen and moisture can be eliminated.

Further, before the film is formed by a sputtering method, it is possible to perform the following treatment (called reverse sputtering): instead of applying a voltage to the target side, an RF power source is used for applying a voltage to the substrate side in an argon, nitrogen, helium, or oxygen atmosphere so that plasma is generated to modify a surface where the film is to be formed. With reverse sputtering, powdery substances (also referred to as particles or dust) attached to the surface where the film is to be formed can be removed.

In the case where the film is formed by a sputtering method, moisture remaining in a deposition chamber used for forming the film can be removed with an entrapment vacuum pump or the like. As the entrapment vacuum pump, a cryopump, an ion pump, or a titanium sublimation pump can be used, for example. Moisture remaining in the deposition chamber can be removed with a turbomolecular pump provided with a cold trap. With the use of the vacuum pump, backflow of exhausted air including impurities can be reduced.

As a method for forming the conductive layer 601 (a), the example of a method for manufacturing the transistor of this embodiment employs, for example, the following steps in order to form a layer by etching part of a film: a resist mask is formed over part of the film by a photolithography process and the film is etched using the resist mask, thereby forming the layer. Note that in this case, the resist mask is removed after the layer is formed.

Note that the resist mask may be formed by an inkjet method. A photomask is not used in an inkjet method; thus, manufacturing cost can be reduced. Alternatively, the resist mask may be formed using a light-exposure mask having a plurality of regions with different transmittances (also referred to as a multi-tone mask). With the use of the multi-tone mask, a resist mask having different thicknesses can be formed, and the number of resist masks used for manufacturing the transistor can be reduced.

Figure 6B:
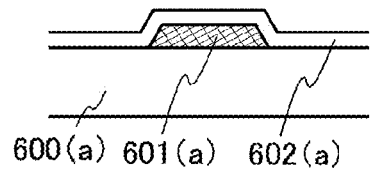

Next, as shown in FIG. 6B, a first insulating film is formed over the conductive layer 601 (a), so that the insulating layer 602 (a) is formed.

For example, a film of a material that can be used for the insulating layer 602 (a) is formed by a sputtering method, a plasma CVD method, or the like, so that the first insulating film can be formed. Alternatively, the first insulating film can be formed by a stack of layers of materials that can be used for the insulating layer 602 (a). Further, when the film formed using a material that can be used for the insulating layer 602 (a) is formed by a high-density plasma-enhanced CVD method (e.g., a high-density plasma-enhanced CVD method using microwaves (e.g., microwaves with a frequency of 2.45 GHz)), the insulating layer 602 (a) can be dense and can have higher breakdown voltage.

Figure 6C:
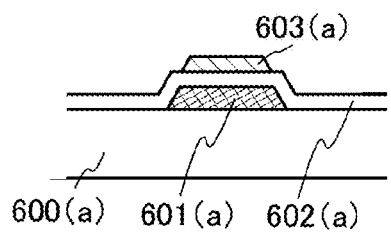

Next, an oxide semiconductor film is formed over the insulating layer 602 (a) and then part of the oxide semiconductor film is etched, whereby the oxide semiconductor layer 603 (a) is formed as shown in FIG. 6C.

For example, a film of an oxide semiconductor material that can be used for the semiconductor layer 603 (a) is formed by a sputtering method, whereby the oxide semiconductor film can be formed. Note that the oxide semiconductor film may be formed in a rare gas atmosphere, an oxygen atmosphere, or a mixed atmosphere of a rare gas and oxygen. Further, in the case where a CAAC oxide semiconductor layer is formed as the semiconductor layer 603 (a), an oxide semiconductor film is formed by a sputtering method while the temperature of the element formation layer over which the oxide semiconductor film is formed is set at higher than or equal to 100° C. and lower than or equal to 500° C., preferably higher than or equal to 200° C. and lower than or equal to 350° C. In this case, it is preferable that the concentration of impurities such as hydrogen or water in a sputtering apparatus be extremely low. For example, when heat treatment is performed before the formation of the oxide semiconductor film, the concentration of impurities such as hydrogen or water in the sputtering apparatus can be reduced. Further, in this case, the insulating layer 602 (a) is preferably flat. For example, the average surface roughness of the insulating layer 602 (a) is preferably less than 0.5 nm, more preferably less than or equal to 0.1 nm.

The oxide semiconductor film can be formed using an oxide target having a composition ratio: $In_2O_3:Ga_2O_3:ZnO=1:1:1$ in molar ratio as a sputtering target. Alternatively, the oxide semiconductor film may be formed using an oxide target having a composition ratio: $In_2O_3:Ga_2O_3:ZnO=1:1:2$ in molar ratio, for example.

The composition ratio of a target of an oxide semiconductor used for forming a film of an In—Sn—Zn—O-based material can be In:Sn:Zn=1:2:2, 2:1:3, 1:1:1, or 20:45:35 in an atomic ratio.

Further, in the case of using a sputtering method, the semiconductor layer 603 (a) is formed in a rare gas (typically argon) atmosphere, an oxygen atmosphere, or a mixed atmosphere of a rare gas and oxygen, for example. In the case where the semiconductor layer 603 (a) is formed in a mixed atmosphere of a rare gas and oxygen, the amount of oxygen is preferably greater than the amount of a rare gas.

Figure 6D:
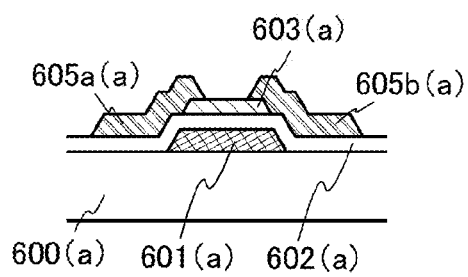

Next, as shown in FIG. 6D, a second conductive film is formed over the insulating layer 602 (a) and the semiconductor layer 603 (a) and is partly etched, so that the conductive layer 605*a* (a) and the conductive layer 605*b* (b) are formed.

For example, a material that can be used for the conductive layer 605*a* (a) and the conductive layer 605*b* (a) is formed by sputtering or the like, whereby the second conductive film can be formed. Alternatively, the second conductive film can be formed by stacking films formed using materials that can be used for the conductive layer 605*a* (a) and the conductive layer 605*b* (a).

Figure 6E:
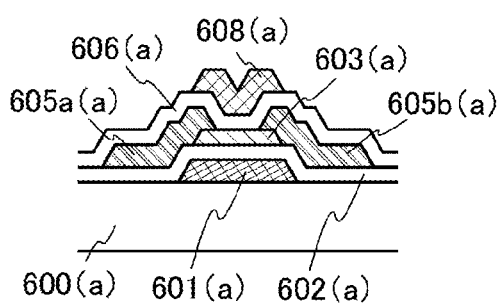

Next, as shown in FIG. 6E, the insulating layer 606 (a) is formed to be in contact with the semiconductor layer 603 (a).

For example, a film that can be used as the insulating layer 606 (a) is formed in a rare gas (typically, argon) atmosphere, an oxygen atmosphere, or a mixed atmosphere of a rare gas and oxygen by a sputtering method, whereby the insulating film 606 (a) can be formed. Forming the insulating layer 606 (a) by a sputtering method can suppress the decrease in the resistance value of part of the semiconductor layer 603 (a) that functions as a back channel of the transistor. The temperature of the substrate at the time when the insulating layer 606 (a) is formed is preferably higher than or equal to room temperature and lower than or equal to 300° C.

Before formation of the insulating layer 606 (a), plasma treatment with the use of a gas of $N_2O$, $N_2$, Ar, or the like may be performed to remove water or the like adsorbed on an exposed surface of the semiconductor layer 603 (a). In the case of performing the plasma treatment, the insulating layer 606 (a) is preferably formed after the plasma treatment without exposure to air.

Further, in the example of the method for manufacturing the transistor in FIG. 5A, heat treatment is performed, for example, at higher than or equal to 600° C. and lower than or equal to 750° C., or higher than or equal to 600° C. and lower than the strain point of the substrate. For example, the heat treatment is performed after the oxide semiconductor film is formed, after part of the oxide semiconductor film is etched, after the second conductive film is formed, after part of the second conductive film is etched, or after the insulating layer 606 (a) is formed.

Note that a heat treatment apparatus for the heat treatment can be an electric furnace or an apparatus for heating an object by heat conduction or heat radiation from a heater such as a resistance heater. For example, a rapid thermal anneal (RTA) apparatus such as a gas rapid thermal anneal (GRTA) apparatus, or a lamp rapid thermal anneal (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, a rare gas or an inert gas (e.g., nitrogen) which does not react with the object by the heat treatment can be used.

After the heat treatment, a high-purity oxygen gas, a high-purity $N_2O$ gas, or ultra-dry air (with a dew point of −40° C. or lower, preferably −60° C. or lower) may be introduced into the furnace that has been used in the above heat treatment. It is preferable that the oxygen gas or the $N_2O$ gas do not contain water, hydrogen, and the like. The purity of the oxygen gas or the $N_2O$ gas which is introduced into the heat treatment apparatus is preferably greater than or equal to 6N, more preferably greater than or equal to 7N (i.e., the impurity concentration of the oxygen gas or the $N_2O$ gas is preferably less than or equal to 1 ppm, more preferably less than or equal to 0.1 ppm). By the action of the oxygen gas or the $N_2O$ gas, oxygen is supplied to the semiconductor layer 603 (a), so that defects caused by oxygen deficiency in the semiconductor layer 603 (a) can be reduced. Note that the high-purity oxygen gas, the high-purity $N_2O$ gas, or the ultra-dry air may be introduced at the time of the heat treatment.

Oxygen doping using oxygen plasma may be performed after the insulating layer 602 (a) is formed, after the oxide semiconductor film is formed, after the conductive layers serving as the source electrode and the drain electrode are formed, after the insulating layer over the conductive layers serving as the source electrode and the drain electrode is formed, or after the heat treatment is performed. For example, an oxygen doping treatment using a high-density plasma of 2.45 GHz may be performed. Alternatively, oxygen doping treatment may be performed by an ion implantation method or ion doping. The oxygen doping can reduce variations in electrical characteristics of transistors which are manufactured. For example, by performing oxygen doping, one of or both the insulating layer 602 (a) and the insulating layer 606 (a) have oxygen having higher proportion than that in the stoichiometric composition.

When the insulating layer which is in contact with the semiconductor layer 603 (a) contains oxygen excessively, the semiconductor layer 603 (a) is easily supplied with oxygen. As a result, an oxygen defect in the semiconductor layer 603 (a) or at an interface between the semiconductor layer 603 (a) and one of or both the insulating layer 602 (a) and the insulating layer 606 (a) can be reduced, which results in further reduction in the carrier concentration in the semiconductor layer 603 (a). Without limitation thereon, in the case where the semiconductor layer 603 (a) contains oxygen excessively by the manufacturing steps, elimination of oxygen from the semiconductor layer 603 (a) can be prevented by the insulating layer in contact with the semiconductor layer 603 (a).

For example, when an insulating layer containing gallium oxide is formed as one or each of the insulating layer 602 (a) and the insulating layer 606 (a), the composition of the gallium oxide can be set to be $Ga_2O_x$ by supplying the insulating layer with oxygen.

Alternatively, when an insulating layer containing aluminum oxide is formed as one or each of the insulating layer 602 (a) and the insulating layer 606 (a), the composition of the aluminum oxide can be set to be $Al_2O_x$ by supplying the insulating layer with oxygen.

Further, when an insulating layer containing gallium aluminum oxide or aluminum gallium oxide is formed as one or each of the insulating layer 602 (a) and the insulating layer 606 (a), the composition of the gallium aluminum oxide or the aluminum gallium oxide can be set to be $Ga_xAl_{2-x}O_{3+\alpha}$ by supplying the insulating layer with oxygen.

Through the above steps, impurities such as hydrogen, water, a hydroxyl group, and hydride (also referred to as a hydrogen compound) are removed from the semiconductor layer 603 (a) and oxygen is supplied to the semiconductor layer 603 (a); thus, the oxide semiconductor layer can be highly purified.

Further, in addition to the heat treatment, after the insulating layer 606 (a) is formed, heat treatment (preferably at higher than or equal to 200° C. and lower than or equal to 600° C., for example, higher than or equal to 250° C. and lower than or equal to 350° C.) may be performed in an inert gas atmosphere or an oxygen gas atmosphere.

In addition, as shown in FIG. 6E, a third conductive film is formed over the insulating layer 606 (a) and part of the third conductive film is etched, whereby the conductive layer 608 (a) is formed.

For example, a film formed using a material that can be used for the conductive layer 608 (a) is formed by a sputtering method, whereby the third conductive film can be formed. The third conductive film can be formed by stacking layers formed of materials that can be used for the third conductive film.

Note that although the example of the method for manufacturing the transistor shown in FIG. 5A is described, this embodiment is not limited to this. For example, as for the components in FIGS. 5B to 5D that have the same designations as the components in FIG. 5A and whose functions are at least partly the same as those of the components in FIG. 5A, the description of the example of the method for manufacturing the transistor shown in FIG. 5A can be referred to as appropriate.

In the case where the regions 604a (c) and 604a (d) or the regions 604b (c) and 604b (d) are formed as shown in FIG. 5C or FIG. 5D, the regions 604a (c) and 604a (d) or the regions 604b (c) and 604b (d) are formed in a self-aligned manner by adding a dopant to a semiconductor layer from a side where a conductive layer serving as a gate is formed with an insulating layer serving as a gate insulating layer provided therebetween.

For example, the dopant can be added with the use of an ion doping apparatus or an ion implantation apparatus.

As described with FIGS. 5A to 5D and FIGS. 6A to 6E, examples of the transistor in this embodiment each include the conductive layer serving as the gate; the insulating layer serving as the gate insulating layer; the oxide semiconductor layer which overlaps with the conductive layer serving as the gate with the insulating layer serving as the gate insulating layer provided therebetween and in which a channel is formed; the conductive layer which is electrically connected to the oxide semiconductor layer and serves as one of the source and the drain; and the conductive layer which is electrically connected to the oxide semiconductor layer and serves as the other of the source and the drain.

The oxide semiconductor layer in which a channel is formed is an oxide semiconductor layer which is made an i-type or substantially i-type by being purified. With the highly purified oxide semiconductor layer, the carrier concentration of the oxide semiconductor layer can be lower than $1\times10^{14}/cm^3$, preferably lower than $1\times10^{12}/cm^3$, further preferably lower than $1\times10^{11}/cm^3$. With the above structure, the off-state current per micrometer of the channel width can be lower than or equal to 10 aA ($1\times10^{-17}$ A), lower than or equal to 1 aA ($1\times10^{-18}$ A), lower than or equal to 10 zA ($1\times10^{-20}$ A), further lower than or equal to 1 zA ($1\times10^{-21}$ A), and furthermore lower than or equal to 100 yA ($1\times10^{-22}$ A). It is preferable that the off-state current of the transistor be as low as possible. The lowest value of the off-state current of the transistor in this embodiment is estimated to be about $10^{-30}$ A/μm.

When a transistor including the oxide semiconductor layer of this embodiment is used as a switch in the semiconductor circuit in the above embodiment, the leakage current of the switch can be extremely small and the semiconductor circuit can have stable input output characteristics.

This embodiment can be combined with any of the other embodiments disclosed in this specification as appropriate.

Embodiment 3

In this embodiment, structural examples of any of the semiconductor device in the above embodiment will be described.

The semiconductor circuit in this embodiment is formed using a transistor including a semiconductor layer in which a channel is formed and which contains a semiconductor belonging to Group 14 of the periodic table (e.g., silicon) and a transistor including an oxide semiconductor layer in which a channel is formed. In this case, the transistor including an oxide semiconductor layer in which a channel is formed can be stacked over the transistor including a semiconductor layer which contains a semiconductor belonging to Group 14 of the periodic table (e.g., silicon). The transistor including a semiconductor layer which contains a semiconductor belonging to Group 14 of the periodic table (e.g., silicon) can be used as the switch 103 and the transistor included in the operational amplifier circuit 111 in FIG. 1, for example.

Figure 7:
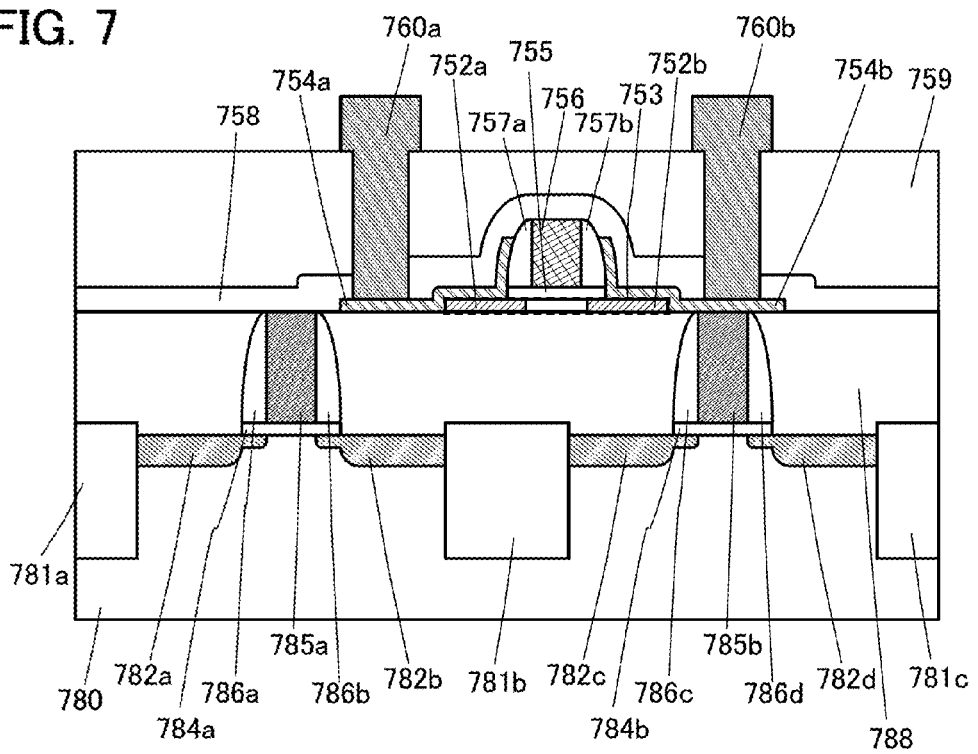
FIG. 7 shows a structure of a semiconductor circuit that is one embodiment of the present invention.

FIG. 7 shows an example in which the transistor including an oxide semiconductor layer in which a channel is formed is stacked over the transistor including a semiconductor layer which contains a semiconductor belonging to Group 14 of the periodic table (e.g., silicon). Note that the components shown in FIG. 7 include those having sizes different from the actual sizes.

In FIG. 7, a p-channel transistor and an n-channel transistor (e.g., the transistor included in the operational amplifier circuit 111 in FIG. 1) each including a semiconductor layer which contains a semiconductor belonging to Group 14 of the periodic table (e.g., silicon) and a transistor (e.g., the transistor 10 in FIG. 1) including an oxide semiconductor layer in which a channel is formed are formed using a semiconductor layer 780, an insulating layer 784*a*, an insulating layer 784*b*, a conductive layer 785*a*, a conductive layer 785*b*, an insulating layer 786*a*, an insulating layer 786*b*, an insulating layer 786*c*, an insulating layer 786*d*, an insulating layer 788, a semiconductor layer 753, a conductive layer 754*a*, a conductive layer 754*b*, an insulating layer 755, a conductive layer 756, an insulating layer 757*a*, an insulating layer 757*b*, an insulating layer 758, an insulating layer 759, a conductive layer 760*a*, and a conductive layer 760*b*.

Further, the semiconductor layer 780 includes a region 782*a*, a region 782*b*, a region 782*c*, and a region 782*d*. The semiconductor layer 780 is provided with insulating regions 781*a* to 781*c*, whereby the transistors are electrically separated from each other.

As the semiconductor layer 780, for example, a semiconductor substrate can be used. Alternatively, a semiconductor layer provided over a different substrate can be used as the semiconductor layer 780.

The region 782*a* and the region 782*b* are regions which are separated from each other and to which a dopant imparting p-type conductivity is added. The region 782*a* and the region 782*b* function as a source region and a drain region of the p-channel transistor. For example, the region 782*a* and the region 782*b* may each be electrically connected to an additionally provided conductive layer.

The region 782*c* and the region 782*d* are regions which are separated from each other and to which a dopant imparting n-type conductivity is added. The region 782*c* and the region 782*d* function as a source region and a drain region of the n-channel transistor. For example, the region 782*c* and the region 782*d* may each be electrically connected to an additionally provided conductive layer.

Note that a low-concentration region may be partly provided in each of the regions 782*a* to 782*d*. In that case, the depth of the low-concentration regions may be smaller than the depth of the rest of the regions 782*a* to 782*d*, but this embodiment is not limited thereto.

The insulating layer 784*a* is provided over a region of the semiconductor layer 780 which is between the insulating region 781*a* and the insulating region 781*b*. The insulating layer 784*a* functions as a gate insulating layer of the p-channel transistor.

The insulating layer 784*b* is provided over a region of the semiconductor layer 780 which is between the insulating region 781*b* and the insulating region 781*c*. The insulating layer 784*b* functions as a gate insulating layer of the n-channel transistor.

Each of the insulating layers 784*a* and 784*b* can be, for example, a layer of a material such as silicon oxide, silicon nitride, silicon oxynitride, silicon nitride oxide, aluminum oxide, aluminum nitride, aluminum oxynitride, aluminum nitride oxide, hafnium oxide, or an organic insulating material (e.g., polyimide or acrylic). The insulating layers 784*a* and 784*b* may be formed by stacking layers of any of materials that can be used for the insulating layers 784*a* and 784*b*.

The conductive layer 785*a* overlaps with the semiconductor layer 780 with the insulating layer 784*a* provided therebetween. A region of the semiconductor layer 780 which overlaps with the conductive layer 785*a* is a channel formation region of the p-channel transistor. The conductive layer 785*a* functions as a gate of the p-channel transistor.

The conductive layer 785*b* overlaps with the semiconductor layer 780 with the insulating layer 784*b* provided therebetween. A region of the semiconductor layer 780 which overlaps with the conductive layer 785*b* is a channel formation region of the n-channel transistor. The conductive layer 785*b* functions as a gate of the n-channel transistor.

Each of the conductive layers 785a and 785b can be, for example, a layer of a metal material such as molybdenum, magnesium, titanium, chromium, tantalum, tungsten, aluminum, copper, neodymium, or scandium or an alloy material containing any of these materials as a main component. The conductive layers 785a and 785b can also be formed by stacking layers of any of materials that can be used for the conductive layers 785a and 785b.

The insulating layer 786a is provided over the insulating layer 784a and is in contact with one of a pair of side surfaces of the conductive layer 785a which face each other.

The insulating layer 786b is provided over the insulating layer 784a and is in contact with the other of the pair of side surfaces of the conductive layer 785a which face each other.

The insulating layer 786c is provided over the insulating layer 784b and is in contact with one of a pair of side surfaces of the conductive layer 785b which face each other.

The insulating layer 786d is provided over the insulating layer 784b and is in contact with the other of the pair of side surfaces of the conductive layer 785b which face each other.

The insulating layer 788 is provided to cover the conductive layer 785a, the conductive layer 785b, the insulating layer 786a, the insulating layer 786b, the insulating layer 786c, and the insulating layer 786d.

Each of the insulating layers 786a to 786d and the insulating layer 788 can be a layer of any of the materials that can be used for the insulating layers 784a and 784b, which may be the same as or different from the material used for the insulating layers 784a and 784b. Further, the insulating layers 786a to 786d and the insulating layer 788 can each be formed by stacking layers of any of materials that can be used for the insulating layers 786a to 786d and the insulating layer 788.

The semiconductor layer 753 is provided over the insulating layer 788. The semiconductor layer 753 includes a region 752a and a region 752b. The region 752a and the region 752b are regions to which a dopant is added, and function as a source region and a drain region. As the dopant, any of the dopants that can be used for the transistor including an oxide semiconductor layer in the above embodiment can be used as appropriate. Note that the region 752a and the region 752b are not necessarily provided.

The semiconductor layer 753 can be a layer of a material that can be used for the semiconductor layer 603 (a) shown in FIG. 5A, for example.

The insulating layer 753 is provided over the semiconductor layer 753. The insulating layer 755 functions as a gate insulating layer of the transistor.

The insulating layer 753 can be a layer of a material that can be used for the insulating layer 602 (a) shown in FIG. 5A, for example. The insulating layer 753 may be formed by stacking layers of any of materials that can be used for the insulating layer 755.

The conductive layer 755 overlaps with the semiconductor layer 753 with the insulating layer 755 provided therebetween. The conductive layer 756 functions as a gate of the transistor.

The conductive layer 756 can be a layer of a material that can be used for the conductive layer 601 (a) shown in FIG. 5A, for example. The conductive layer 756 may be formed by stacking layers of any of materials that can be used for the conductive layer 756.

The insulating layer 757a and the insulating layer 757b are provided over the insulating layer 755 and in contact with side surfaces of the conductive layer 756. Note that the insulating layer 757a and the insulating layer 757b are not necessarily provided.

The conductive layer 754a is in contact with and electrically connected to the semiconductor layer 753. The conductive layer 754a functions as a source or a drain of the transistor including an oxide semiconductor layer.

The conductive layer 754b is in contact with and electrically connected to the semiconductor layer 753. The conductive layer 754b is electrically connected to the conductive layer 785b. The conductive layer 754b functions as the source or the drain of the transistor including an oxide semiconductor layer.

Each of the conductive layers 754a and 754b can be, for example, a layer of a material that can be used for the conductive layers 605a (a) and 605b (a) shown in FIG. 5A. The conductive layers 754a and 754b may be formed by stacking layers of any of materials that can be used for the conductive layers 754a and 754b.

The insulating layer 758 is provided over the conductive layer 756, the insulating layer 757a, the insulating layer 757b, the conductive layer 754a, and the conductive layer 754b.

The insulating layer 758 can be a layer of a material that can be used for the insulating layer 602 (a) shown in FIG. 5A, for example. The insulating layer 758 may be formed by stacking layers of any of materials that can be used for the insulating layer 759. The insulating layer 758 functions as a protective layer suppressing entry of an impurity.

The insulating layer 759 is provided over the insulating layer 758.

The insulating layer 759 can be a layer of a material that can be used for the insulating layer 602 (a) shown in FIG. 5A, for example. The insulating layer 759 may be formed by stacking layers of any of materials that can be used for the insulating layer 759.

The conductive layer 760a is electrically connected to the conductive layer 754a through an opening formed in the insulating layer 758 and the insulating layer 759. The conductive layer 760a functions as the source or the drain of the transistor including an oxide semiconductor layer.

The conductive layer 760b is electrically connected to the conductive layer 754b through an opening formed in the insulating layer 758 and the insulating layer 759. The conductive layer 760b functions as the source or the drain of the transistor including an oxide semiconductor layer.

Each of the conductive layers 760a and 760b can be, for example, a layer of a material that can be used for the conductive layers 605a (a) and 605b (a) shown in FIG. 5A. The conductive layers 760a and 760b may be formed by stacking layers of any of materials that can be used for the conductive layers 760a and 760b.

The above is the description of the structural example of the semiconductor circuit shown in FIG. 7.

As described with reference to FIG. 7, in the structural example of the semiconductor circuit in this embodiment, the semiconductor circuit is formed by stacking transistors which include semiconductor layers formed using different materials, whereby the circuit area can be reduced.

This embodiment can be combined with any of the other embodiments disclosed in this specification as appropriate.

Embodiment 4

In this embodiment, oxide materials that can be used in any of the above embodiments will be described with reference to FIGS. 8A to 8E, FIGS. 9A to 9C, and FIGS. 10A to 10C.

A transistor including a CAAC-OS described as an example in this embodiment can have the field effect mobility higher than that of a transistor including an amorphous oxide semiconductor. For example, the transistor including a CAAC-OS can operate in a higher frequency band.

In this embodiment, an oxide semiconductor including a crystal with c-axis alignment, which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis). Such an oxide semiconductor is also referred to as a c-axis aligned crystalline oxide semiconductor (CAAC-OS).

In a broad sense, a CAAC-OS means a non-single-crystal oxide semiconductor including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC-OS is not a single crystal, but does not consist only of an amorphous portion. Although the CAAC-OS includes a crystallized portion (crystal portion), a boundary between one crystal portion and another crystal portion is not clear in some cases.

Nitrogen may be substituted for part of oxygen included in the CAAC-OS. The c-axes of the crystal portions included in the CAAC-OS may be aligned in one direction (e.g., a direction perpendicular to a surface of a substrate over which the CAAC-OS is formed or a top surface of the CAAC-OS). Alternatively, the normals of the a-b planes of the individual crystal portions included in the CAAC-OS may be aligned in one direction (e.g., a direction perpendicular to a surface of a substrate over which the CAAC-OS is formed or a surface of the CAAC-OS, or the like).

The CAAC-OS can be a conductor, a semiconductor, or an insulator depending on its composition or the like. The CAAC-OS transmits or does not transmit visible light depending on its composition or the like.

As an example of such a CAAC-OS, there is an oxide semiconductor which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

The CAAC-OS film is not completely single crystal nor completely amorphous. The CAAC-OS film is an oxide semiconductor film with a crystal-amorphous mixed phase structure where crystal portions and amorphous portions are included in an amorphous phase. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility due to the grain boundary is suppressed.

In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal portion may be different from those of another crystal portion. In this specification, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal portion is the direction parallel to a normal vector of the surface where the CAAC-OS film is formed or a normal vector of the surface of the CAAC-OS film. The crystal portion is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

The CAAC-OS will be described in detail with reference to FIGS. 8A to 8E, FIGS. 9A to 9C, and FIGS. 10A to 10C. In FIGS. 8A to 8E, FIGS. 9A to 9C, and FIGS. 10A to 10C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 8A to 8E, O surrounded by a circle represents a tetracoordianate O atom and a double circle represents a tricoordinate O atom.

Figure 8A:
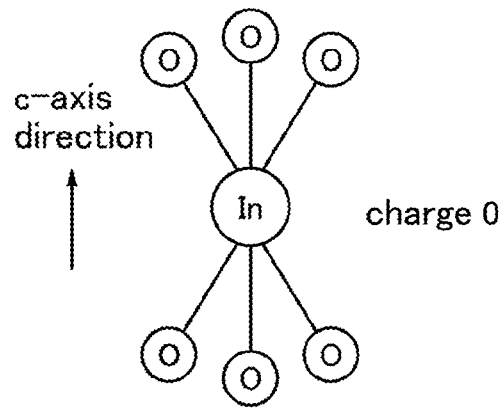
FIGS. 8A to 8E show crystal structures of an oxide material.

FIG. 8A shows a structure including one hexacoordinate O. In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 8A is actually an octahedral structure, but is shown as a planar structure for simplicity. Note that three tetracoordinate O atoms exist in each of an upper half and a lower half in FIG. 8A. In the small group shown in FIG. 8A, charge is 0.

Figure 8D:
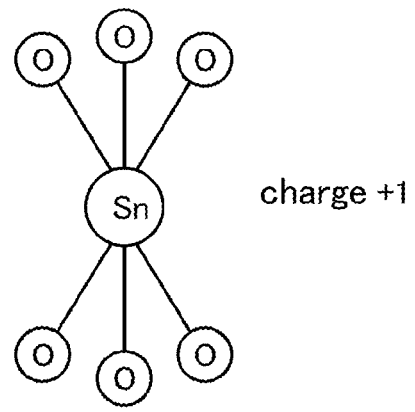
Figure 8B:
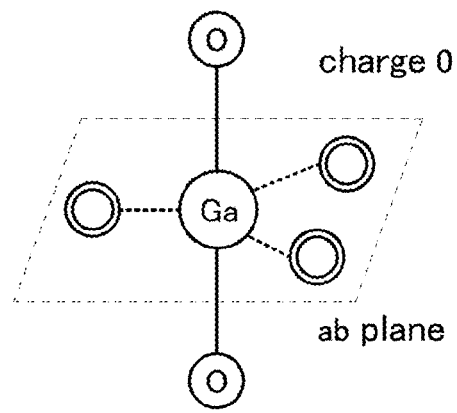

FIG. 8B shows a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 8B. An In atom can also have the structure shown in FIG. 8B because an In atom can have five ligands. In the small group shown in FIG. 8B, charge is 0.

Figure 8E:
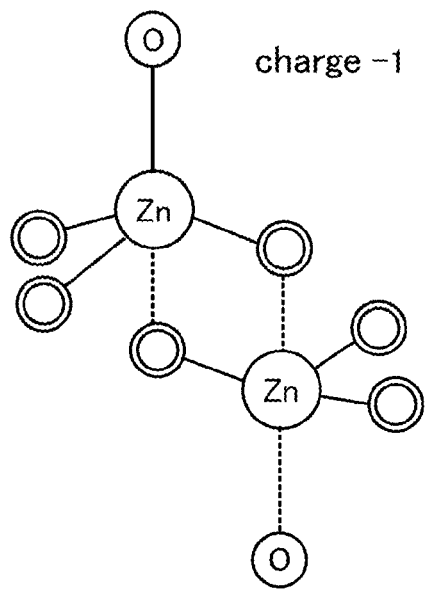
Figure 8C:
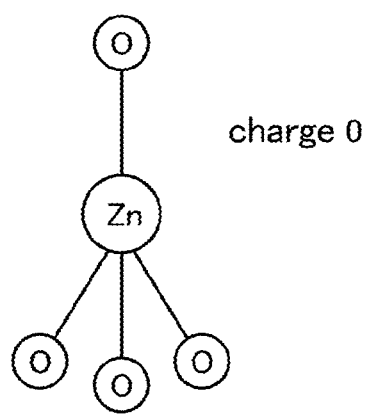

FIG. 8C shows a structure including one tetracoordinate Zn atom and four tetracoordinate O atoms proximate to the Zn atom. In FIG. 8C, one tetracoordinate O atom exists in an upper half and three tetracoordinate O atoms exist in a lower half Alternatively, three tetracoordinate O atoms may exist in the upper half and one tetracoordinate O atom may exist in the lower half in FIG. 8C. In the small group shown in FIG. 8C, charge is 0.

FIG. 8D shows a structure including one hexacoordinate Sn atom and six tetracoordinate O atoms proximate to the Sn atom. In FIG. 8D, three tetracoordinate O atoms exist in each of an upper half and a lower half In the small group shown in FIG. 8D, charge is +1.

FIG. 8E shows a small group including two Zn atoms. In FIG. 8E, one tetracoordinate O atom exists in each of an upper half and a lower half In the small group shown in FIG. 8E, charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 8A each have three proximate In atoms in the downward direction, and the three O atoms in the lower half each have three proximate In atoms in the upward direction. The one O atom in the upper half with respect to the pentacoordinate Ga atom in FIG. 8B has one proximate Ga atom in the downward direction, and the one O atom in the lower half has one proximate Ga atom in the upward direction. The one O atom in the upper half with respect to the tetracoordinate Zn atom in FIG. 8C has one proximate Zn atom in the downward direction, and the three O atoms in the lower half each have three proximate Zn atoms in the upward direction. Similarly, the number of the tetracoordinate O atoms below the metal atom is equal to the number of the metal atoms proximate to and above each of the tetracoordinate O atoms. Since the coordination number of the tetracoordinate O atom is four, the sum of the number of the metal atoms proximate to and below the O atom and the number of the metal atoms proximate to and above the O atom is four. Therefore, when the sum of the number of tetracoordinate O atoms above a metal atom and the number of tetracoordinate O atoms below another metal atom is four, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom having the above coordination number is bonded to another metal atom having the above coordination number through a tetracoordinate O atom in the c-axis direction. In addition to the above, a medium group can be formed in a different manner by combining a plurality of small groups so that the total charge of the layered structure is 0.

Figure 9A:
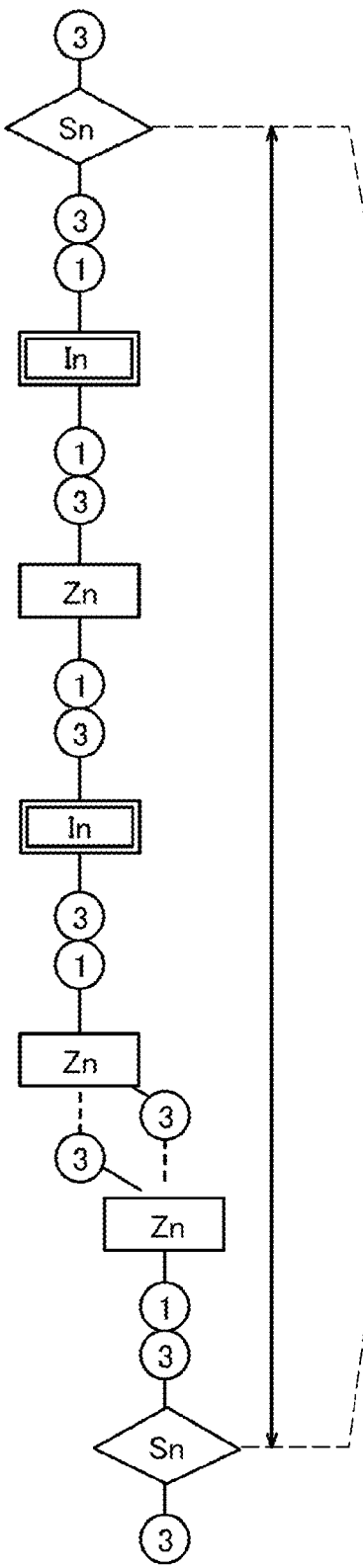
FIGS. 9A to 9C show a crystal structure of an oxide material.
Figure 9B:
Figure 9C:
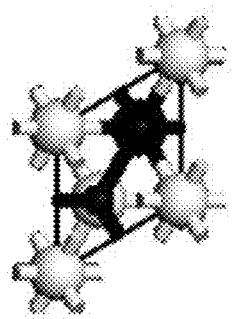

FIG. 9A shows a model of a medium group included in a layered structure of an In—Sn—Zn—O system. FIG. 9B shows a large group including three medium groups. Note that FIG. 9C shows an atomic arrangement in the case where the layered structure in FIG. 9B is observed from the c-axis direction.

In FIG. 9A, for simplicity, a tricoordinate O atom is omitted and tetracoordinate O atoms are shown by a circle; the number in the circle shows the number of tetracoordinate O atoms. For example, three tetracoordinate O atoms existing in each of an upper half and a lower half with respect to a Sn atom are denoted by circled 3. Similarly, in FIG. 9A, one tetracoordinate O atom existing in each of an upper half and a lower half with respect to an In atom is denoted by circled 1. FIG. 9A also shows a Zn atom proximate to three tetracoordinate O atoms in an upper half and one tetracoordinate O atom in a lower half, and a Zn atom proximate to one tetracoordinate O atom in an upper half and three tetracoordinate O atoms in a lower half.

In the medium group included in the layered structure of an In—Sn—Zn—O system in FIG. 9A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, charge for one bond of a tricoordinate O atom and charge for one bond of a tetracoordinate O atom can be assumed to be −0.667 and −0.5, respectively. For example, charge of a (hexacoordinate or pentacoordinate) In atom, charge of a (tetracoordinate) Zn atom, and charge of a (pentacoordinate or hexacoordinate) Sn atom are +3, +2, and +4, respectively. Accordingly, charge in a small group including a Sn atom is +1. Therefore, charge of −1, which cancels +1, is needed to form a layered structure including a Sn atom. As a structure having charge of −1, the small group including two Zn atoms as shown in FIG. 8E can be given. For example, with one small group including two Zn atoms, charge of one small group including a Sn atom can be cancelled, so that the total charge of the layered structure can be 0.

When the large group shown in FIG. 9B is repeated, a crystal of an In—Sn—Zn—O system ($In_2SnZn_3O_8$) can be obtained. Note that the layered structure of an In—Sn—Zn—O system which is obtained can be expressed as a composition formula, $In_2SnZn_2O_7(ZnO)_m$ (m is 0 or a natural number).

The above-described rule also applies to the following oxides: a four-component metal oxide such as an In—Sn—Ga—Zn—O system oxide; a three-component metal oxide such as an In—Ga—Zn—O system oxide (also referred to as IGZO), an In—Al—Zn—O system oxide, a Sn—Ga—Zn—O system oxide, an Al—Ga—Zn—O system oxide, a Sn—Al—Zn—O system oxide, an In—Hf—Zn—O system oxide, an In—La—Zn—O system oxide, an In—Ce—Zn—O system oxide, an In—Pr—Zn—O system oxide, an In—Nd—Zn—O system oxide, an In—Sm—Zn—O system oxide, an In—Eu—Zn—O system oxide, an In—Gd—Zn—O system oxide, an In—Tb—Zn—O system oxide, an In—Dy—Zn—O system oxide, an In—Ho—Zn—O system oxide, an In—Er—Zn—O system oxide, an In—Tm—Zn—O system oxide, an In—Yb—Zn—O system oxide, or an In—Lu—Zn—0 system oxide; a two-component metal oxide such as an In—Zn—O system oxide, a Sn—Zn—O system oxide, an Al—Zn—O system oxide, a Zn—Mg—O system oxide, a Sn—Mg—O system oxide, an In—Mg—O system oxide, or an In—Ga—O system oxide; and the like.

Figure 10A:
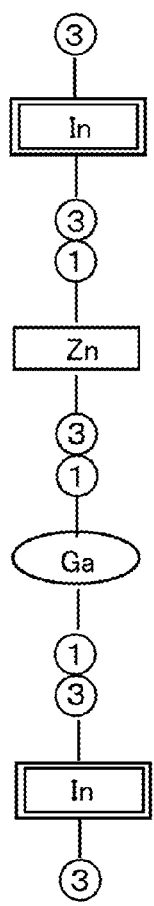
FIGS. 10A to 10C show a crystal structure of an oxide material.

As an example, FIG. 10A shows a model of a medium group included in a layered structure of an In—Ga—Zn—O system.

In the medium group included in the layered structure of an In—Ga—Zn—O system in FIG. 10A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate P atom in a lower half with respect to the Ga atom. A plurality of such medium groups are bonded to form a large group.

Figure 10B:
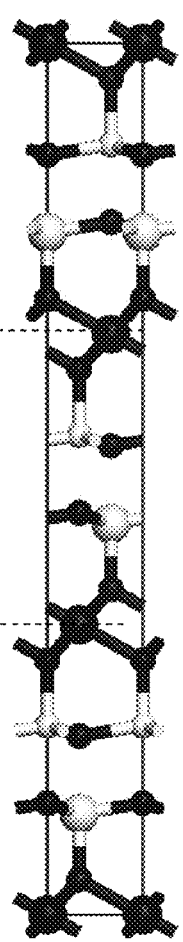
Figure 10C:
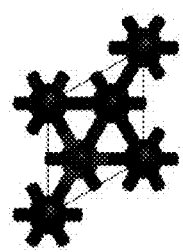
Figure 11:
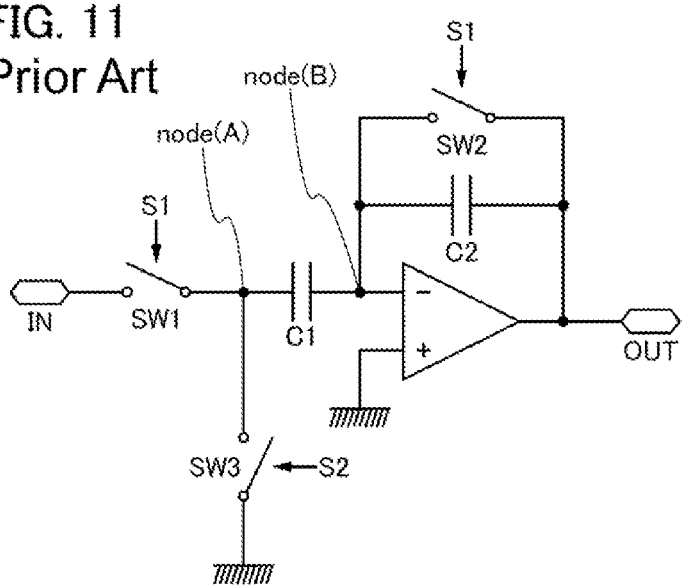
FIG. 11 shows a conventional switched capacitor amplifier circuit.

FIG. 10B shows a large group including three medium groups. Note that FIG. 10C shows an atomic arrangement in the case where the layered structure in FIG. 10B is observed from the c-axis direction.

Here, since charge of a (hexacoordinate or pentacoordinate) In atom, charge of a (tetracoordinate) Zn atom, and charge of a (pentacoordinate) Ga atom are +3, +2, +3, respectively, charge of a small group including any of an In atom, a Zn atom, and a Ga atom is 0. As a result, the total charge of a medium group having a combination of such small groups is always 0.

In order to form the layered structure of an In—Ga—Zn—O system, a large group can be formed using not only the medium group shown in FIG. 10A but also a medium group in which the arrangement of the In atom, the Ga atom, and the Zn atom is different from that in FIG. 10A.

When the large group shown in FIG. 10B is repeated, a crystal of an In—Ga—Zn—O system can be obtained. Note that the layered structure of an In—Ga—Zn—O system which is obtained can be expressed as a composition formula, $InGaO_3(ZnO)_n$ (n is a natural number).

With the use of a transistor including a CAAC-OS, the field effect mobility can be higher than that in a transistor including an amorphous oxide semiconductor. Such a transistor can operate in high frequency band, so that the transistor can be used for a CPU or the like, for example.

This embodiment can be combined with any of the other embodiments disclosed in this specification as appropriate.

This application is based on Japanese Patent Application serial No. 2011-101940 filed with Japan Patent Office on Apr. 28, 2011, the entire contents of which are hereby incorporated by reference.

What is claimed is:

1. A semiconductor circuit comprising:
   a first switching element and a first capacitor connected in series to each other;
   a second switching element and a second capacitor connected in parallel to each other;
   an operational amplifier circuit; and
   a third switching element,
   wherein the third switching element is directly connected to the first switching element and the first capacitor and is directly connected to an output terminal of the operational amplifier circuit,
   wherein an input signal is sampled and a discrete time signal is output, and
   wherein at least one of the first, second, and third switching elements comprises a field-effect transistor whose leakage current in an off state is less than or equal to $1 \times 10^{-17}$ A per channel width of 1 μm.

2. The semiconductor circuit according to claim 1, wherein in the field-effect transistor, an oxide semiconductor is comprised in a semiconductor layer in which a channel is formed.

3. A semiconductor circuit comprising:
   an operational amplifier circuit;
   a first switching element which is electrically connected to a first input terminal of the operational amplifier circuit through a first capacitor;
   a second capacitor which is electrically connected between the first input terminal and a first output terminal of the operational amplifier circuit;
   a second switching element which is electrically connected between the first input terminal and the first output terminal of the operational amplifier circuit;
   a third switching element which is electrically connected to a second input terminal of the operational amplifier circuit through a third capacitor;
   a fourth capacitor which is electrically connected between the second input terminal and a second output terminal of the operational amplifier circuit;
   a fourth switching element which is electrically connected between the second input terminal and the second output terminal of the operational amplifier circuit, and
   a fifth switching element which is directly connected to the first switching element and the first capacitor and is directly connected to the first output terminal of the operational amplifier circuit,
   wherein the second switching element and the second capacitor are connected in parallel to each other, and
   wherein at least one of the first switching element, the second switching element, the third switching element, the fourth switching element, and the fifth switching element comprises a field-effect transistor whose leakage current in an off state is less than or equal to $1 \times 10^{-17}$ A per channel width of 1 μm.

4. The semiconductor circuit according to claim 3, wherein in the field-effect transistor, an oxide semiconductor is comprised in a semiconductor layer in which a channel is formed.

5. The semiconductor circuit according to claim 3, further comprising a sixth switching element,
   wherein the sixth switching element is electrically to the first input terminal and the second input terminal, and
   wherein the sixth switching element comprises a field-effect transistor whose leakage current in an off state is less than or equal to $1 \times 10^{-17}$ A per channel width of 1 μm.

* * * * *

UNITED STATES PATENT AND TRADEMARK OFFICE
CERTIFICATE OF CORRECTION

PATENT NO. : 8,803,559 B2  Page 1 of 1
APPLICATION NO. : 13/453092
DATED : August 12, 2014
INVENTOR(S) : Kouhei Toyotaka It is certified that error appears in the above-identified patent and that said Letters Patent is hereby corrected as shown below:

In the Specification

Column 8, line 19 – replace "10" with --103--;

Column 14, line 17 – replace "$Ga_zO_x$" with --$Ga_2O_x$--;

Column 14, line 30 – replace "Sn-Ga-Z-O" with --Sn-Ga-Zn-O--;

Column 21, line 65 – replace "10" with --102--;

Column 23, line 46 – replace "753" with --755--;

Column 23, line 49 – replace "753" with --755--;

Column 23, line 51 – replace "753" with --755--;

Column 23, line 54 – replace "755" with --756--;

Column 26, line 50 – after "hexacoordinate" delete "O";

Column 27, line 5 – after "half" insert --.--;

Column 27, line 12 – after "half" insert --.--; (second occurrence)

Column 27, line 16 – after "half" insert --.--; (second occurrence)

Column 28, line 60 – replace "In-Lu-Zn-0" with --In-Lu-Zn-O--;

Column 29, line 11 – replace "P" with --O--.

Signed and Sealed this
Ninth Day of June, 2015

Michelle K. Lee
*Director of the United States Patent and Trademark Office*